(12) United States Patent
Taniguchi et al.

(10) Patent No.: US 6,919,777 B2
(45) Date of Patent: Jul. 19, 2005

(54) SURFACE ACOUSTIC WAVE FILTER DEVICE

(75) Inventors: Norio Taniguchi, Shiga-ken (JP); Toshiaki Takata, Kanazawa (JP); Mitsuo Takeda, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/111,003

(22) PCT Filed: Aug. 15, 2001

(86) PCT No.: PCT/JP01/07042

§ 371 (c)(1),
(2), (4) Date: Sep. 10, 2002

(87) PCT Pub. No.: WO02/17483

PCT Pub. Date: Feb. 28, 2002

(65) Prior Publication Data

US 2003/0058066 A1 Mar. 27, 2003

(30) Foreign Application Priority Data

Aug. 21, 2000 (JP) ........................................ 2000-249954
Jul. 26, 2001 (JP) ........................................ 2001-225768

(51) Int. Cl.$^7$ .............................. H03H 9/64; H03H 9/72
(52) U.S. Cl. ....................................... 333/133; 333/193
(58) Field of Search ................................ 333/193–196, 333/133

(56) References Cited

U.S. PATENT DOCUMENTS

| | | | | |
|---|---|---|---|---|
| 5,459,368 A | * | 10/1995 | Onishi et al. | 310/313 R |
| 5,471,722 A | | 12/1995 | Yatsuda | 29/25.35 |
| 5,561,406 A | * | 10/1996 | Ikata et al. | 333/126 |
| 5,631,612 A | * | 5/1997 | Satoh et al. | 333/193 |
| 5,682,126 A | * | 10/1997 | Plesski et al. | 333/193 |
| 6,150,900 A | * | 11/2000 | Kadota et al. | 333/133 |
| 6,150,904 A | * | 11/2000 | Taniguchi et al. | 333/193 |
| 6,351,194 B2 | * | 2/2002 | Takahashi et al. | 333/133 |
| 6,404,302 B1 | * | 6/2002 | Satoh et al. | 333/193 |
| 6,417,574 B1 | * | 7/2002 | Misawa et al. | 257/778 |
| 6,489,860 B1 | * | 12/2002 | Ohashi | 333/133 |

FOREIGN PATENT DOCUMENTS

| | | |
|---|---|---|
| JP | 04-065909 | 3/1992 |
| JP | 9-321569 | 12/1997 |
| JP | 10-093375 | 4/1998 |
| JP | 10-093382 | 4/1998 |
| JP | 10-200370 | 7/1998 |
| JP | 10-224178 | 8/1998 |
| JP | 11-055067 | 2/1999 |
| JP | 11-163218 | * 6/1999 |
| JP | 11-227429 | 8/1999 |
| JP | 11-340779 | 12/1999 |
| JP | 2000-223989 | 8/2000 |
| JP | 2001-160731 | * 6/2001 |

OTHER PUBLICATIONS

English language translation of Abstract of JP 5–183380, Jul. 1993.
English language translation of Abstract of JP 2001–160731, Jun. 2001.

* cited by examiner

*Primary Examiner*—Barbara Summons
(74) *Attorney, Agent, or Firm*—Keating & Bennett, LLP

(57) ABSTRACT

A surface acoustic wave filter device includes a surface acoustic wave filter element having a ladder type circuit electrically connected and mechanically fixed to a package by a face down mounting method. A micro-strip line connected to series arm resonator and/or a parallel arm resonator is provided inside the package, whereby excellent filter characteristics are provided by the addition of the inductance component thereof.

45 Claims, 19 Drawing Sheets

SURFACE ACOUSTIC WAVE FILTER DEVICE

BACKGROUND OF THE INVENTION

1. Field of the Invention

The present invention relates to a surface acoustic wave filter, and more particularly, to a surface acoustic wave filter device including a ladder type circuit.

2. Description of the Related Art

A conventional band-pass filter includes a ladder type circuit having a plurality of one terminal pair surface acoustic wave resonators that are connected in a ladder configuration (e.g., Japanese Unexamined Patent Application Publication No. 05-18338).

In this band-pass filter, a plurality of one terminal pair surface acoustic wave resonators are connected in series between an input terminal and an output terminal as series arm resonators to define series arms. In addition, a plurality of one terminal pair surface acoustic wave resonators are connected in parallel between the series arms and ground as parallel arm resonators to define parallel arms.

The band-pass filter including a ladder type circuit has reduced insertion loss and a wide pass band, and is commonly used as a band-pass filter in a portable telephone.

Japanese Unexamined Patent Application Publication No. 05-183380 discloses that an inductance component is connected in series to the above-described series arm resonator or parallel arm resonator, and this provides an increased bandwidth.

Also, Japanese Unexamined Patent Application Publication No. 10-93382 discloses a structure wherein an inductance is added to parallel arm resonators in a surface acoustic wave filter device having a ladder type circuit. FIG. 18 shows a circuit configuration of the surface acoustic wave filter device according to this prior art. In the surface acoustic wave filter device 501, series arm resonators S1 and S2 and parallel arm resonators P1 to P3 are connected to one another so as to define a ladder type circuit. Here, an inductance L is inserted between the parallel arm resonators P1 to P3 and the ground potential to thereby provide an increased pass band width and an increased attenuation value in the vicinity of a pass band.

On the other hand, Japanese Unexamined Patent Application Publication No. 04-65909 discloses a structure in which a surface acoustic wave filter element is connected to a package by a face down mounting process. Conventionally, in the package in which the surface acoustic wave filter element is accommodated, the electrodes of a package and the electrodes of the surface acoustic wave filter element are connected by bonding wires. In contrast, the surface acoustic wave filter device disclosed in this prior art has a reduced size by utilizing the face down mounting process. FIG. 19 shows a schematic sectional view of a package of a surface acoustic wave filter element provided using this face down mounting process.

In the surface acoustic wave filter device 601, a surface acoustic wave filter element 603 is provided in a package 602. The package 602 includes a base board 602a, a side wall 602b, and a cap 602c.

On the base board 602a, a die-attach portion 602d is provided having a plurality of electrode pads electrically connected to the surface acoustic wave filter element 603. The surface acoustic wave filter element 603 includes a piezoelectric substrate 603a, and electrodes of a surface acoustic wave filter element are provided on the bottom surface of the piezoelectric substrate 603a. The electrodes provided on the bottom surface of the piezoelectric substrate 603a are electrically connected to the electrode pads in the die-attach portion 602d via bumps 604, and the surface acoustic wave filter element 603 is mechanically fixed to the die-attach portion 602d via the bumps 604.

In a face down mounting method for bonding, a surface including electrodes defining a surface acoustic wave filter element of the piezoelectric substrate is attached to a package by bumps. Since no bonding wires are required, a surface acoustic wave filter device having a reduced size is produced.

As disclosed in the Japanese Unexamined Patent Application Publications Nos. 05-183380 and 10-93382, when an inductance is added to a series arm resonator or a parallel arm resonator in a surface acoustic wave filter device having a ladder type circuit, the filter characteristics thereof are improved. Also, when connecting a surface acoustic wave filter element and the electrodes on a package by a bonding wire, the above-described inductance can be included using the bonding wire.

However, in the surface acoustic wave filter device 601, which is packaged by above-described face down mounting process, since no bonding wires are provided, an inductance component cannot be added to the surface acoustic wave filter device 601 using the bonding wire. A small inductance component may be provided by rooting electrodes connecting the external electrodes provided on the package to the die-attach portion, but a large inductance cannot be obtained by such rooting electrodes.

Therefore, in the surface acoustic wave filter device disclosed in the Japanese Unexamined Patent Application Publication No. 04-65909, it is difficult to achieve an increased pass band width and an increased attenuation value in the vicinity of a pass band, by the addition of inductance.

Japanese Unexamined Patent Application Publication No. 04-65909 describes that, by adding inductance components between each of the input/output signal terminals and the ground terminal in the package, an input/output impedance matching is achieved without using external elements. This description, however, applies to a surface acoustic wave filter having a structure which must achieve an input/output impedance matching outside the surface acoustic wave filter. Accordingly, in the case of a surface acoustic wave filter having a ladder circuit configuration which does not need to be matched, it is unnecessary to achieve an impedance matching between each of the input/output signal terminals and the ground terminal in such a package.

Also, in the Japanese Unexamined Patent Application Publication No. 04-65909, inductance components are provided in the die-attach portion. However, with this structure, an electromagnetic coupling occurs between the wiring and the die-attach portion on the piezoelectric substrate of the surface acoustic wave filter element, such that the filter characteristics thereof deteriorate. In addition, it is necessary to adjust the position and the number of bumps to fix and electrically connect the surface acoustic wave filter element and the package in order to provide an inductance component in the die-attach portion. However, since the position and the number of bumps do not necessarily achieve the sufficient electrical connections and mechanical bonding, the reliability of surface acoustic wave filter device deteriorates.

SUMMARY OF THE INVENTION

In order to overcome the above-described problems, preferred embodiments of the present invention provide a surface acoustic wave filter device having excellent filter characteristics, in which a surface acoustic wave filter element including a ladder type circuit is accommodated in a package by the face down mounting process. Inductances are added to parallel arm resonators and/or series arm resonators, and the deterioration of filter characteristics by the electromagnetic coupling between the electrodes on the surface acoustic wave filter element and the inductances provided in the package is prevented.

In accordance with a preferred embodiment of the present invention, a surface acoustic wave filter device includes a surface acoustic wave filter element including a piezoelectric substrate and a plurality of one terminal pair surface acoustic wave elements provided on the piezoelectric substrate, and in which the one terminal pair surface acoustic wave elements are connected to define a parallel arm resonator and a series arm resonator in a ladder circuit, and a package accommodating the surface acoustic wave filter element. In this surface acoustic wave filter device, the surface acoustic wave filter element is bonded via a plurality of bumps by using the face down mounting process and is accommodated in the package. This surface acoustic wave filter device further includes an inductance component of a microstrip line which is provided in the package and connected to at least one of the series arm resonator and the parallel arm resonator.

In accordance with another preferred embodiment of the present invention, the above-described package includes a die-attach portion including a plurality of electrode pads which are connected via the bumps to one of a signal terminal and a ground terminal of the surface acoustic wave filter element, and a plurality of external electrodes which are electrically connected to at least one of the electrode pads, and connected to one of a signal line and a ground line outside the surface acoustic wave filter device.

In accordance with another preferred embodiment of the present invention, the above-described microstrip line is preferably connected between the electrode pad connected to the signal terminal of the series arm resonator and the external electrode connected to the signal line outside the surface acoustic wave filter device.

In accordance with another preferred embodiment of the present invention, the above-described microstrip line is provided between the electrode pad connected to the ground terminal of at least one parallel arm resonator via the bumps, and the external electrode which is connected to the ground line outside the package.

In accordance with another preferred embodiment of the present invention, the surface acoustic wave filter device includes at least two parallel arm resonators. In this surface acoustic wave filter device, the ground terminals of all the parallel arm resonators are commonly connected on the piezoelectric substrate, and the microstrip line is connected between the portion where the ground terminals of the parallel arm resonators are commonly connected and the external electrode provided in the package.

In accordance with still another preferred embodiment of the present invention, the surface acoustic wave filter device includes at least two parallel arm resonators. In this surface acoustic wave filter device, the package-side electrode pads connected to the ground terminals of all the parallel arm resonators define a common electrode pad, and the microstrip line is provided on the path between the common electrode pad and the external electrode.

In accordance with still another preferred embodiment of the present invention, the surface acoustic wave filter device includes at least three parallel arm resonators, and an electrode land which is provided on the piezoelectric substrate, and to which the ground terminals of at least two parallel arm resonators are each connected. In this surface acoustic wave filter device, die microstrip line is provided on the path between the electrode land connected to the ground terminals of at least two parallel arm resonators and the external electrode to which the electrode land is connected, and the parallel arm resonator other than the above-described at least two parallel arm resonators is electrically isolated from the above-described at least two parallel arm resonators on the piezoelectric substrate, and is electrically connected to the external electrode other than the package-side external electrode connected to the above-described at least two parallel arm resonators.

In accordance with a further preferred embodiment of the present invention, the surface acoustic wave filter device includes at least three parallel arm resonators. In this surface acoustic wave filter device, the plurality of electrode pads include a common electrode pad connected to the ground terminals of at least two parallel arm resonators among the parallel arm resonators, and the microstrip line is provided on the path between the common electrode pad and the external electrode to which the common electrode pad is connected, and the parallel arm resonator other than the above-described at least two parallel arm resonators is electrically isolated from the above-described at least two parallel arm resonators, at a die-attach portion including the plurality of electrode pads, and is electrically connected to the external electrode other than the package-side external electrode connected to the above-described at least two parallel arm resonators.

In accordance with a further preferred embodiment of the present invention, the above-described microstrip line is disposed in the package at the position other than the position of the die-attach portion.

In accordance with a yet further preferred embodiment of the present invention, the above-described package includes a base board on which the surface acoustic wave filter element is mounted, an annular side wall provided on the base board, and a cap member attached to the annual side wall so as to close the upper end thereof. Herein, a main portion of the microstrip line is disposed between the side wall and the base board.

In accordance with another preferred embodiment of the present invention, the above-described package includes a first case member on which the surface acoustic wave filter element is mounted, and a second case member enclosing the surface acoustic wave filter element mounted on the first case member. Herein, a main portion of the microstrip line is provided inside the first case member.

Here, "a main portion of a microstrip line" refers to at least 50% of the entire length of a microstrip line.

In accordance with still another preferred embodiment of the present invention, the signal terminal at the input/output end of the surface acoustic wave filter element and at least one ground terminal thereof are arranged so as to be rotated by approximately 90° with respect to the imaginary line which passes the approximate center of the piezoelectric substrate of the surface acoustic wave filter element, and which is substantially perpendicular to the piezoelectric substrate, with respect to the external electrode connected to the signal line at the input/output end and the external electrode connected to at least one ground potential among the plurality of external electrodes.

The communication device in accordance with another preferred embodiment of the present invention includes a surface acoustic wave filter device in accordance with the present invention.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Hereinafter, the surface acoustic wave filter device according to preferred embodiments of the present invention will be described in detail with reference to the drawings.

Figure 1:
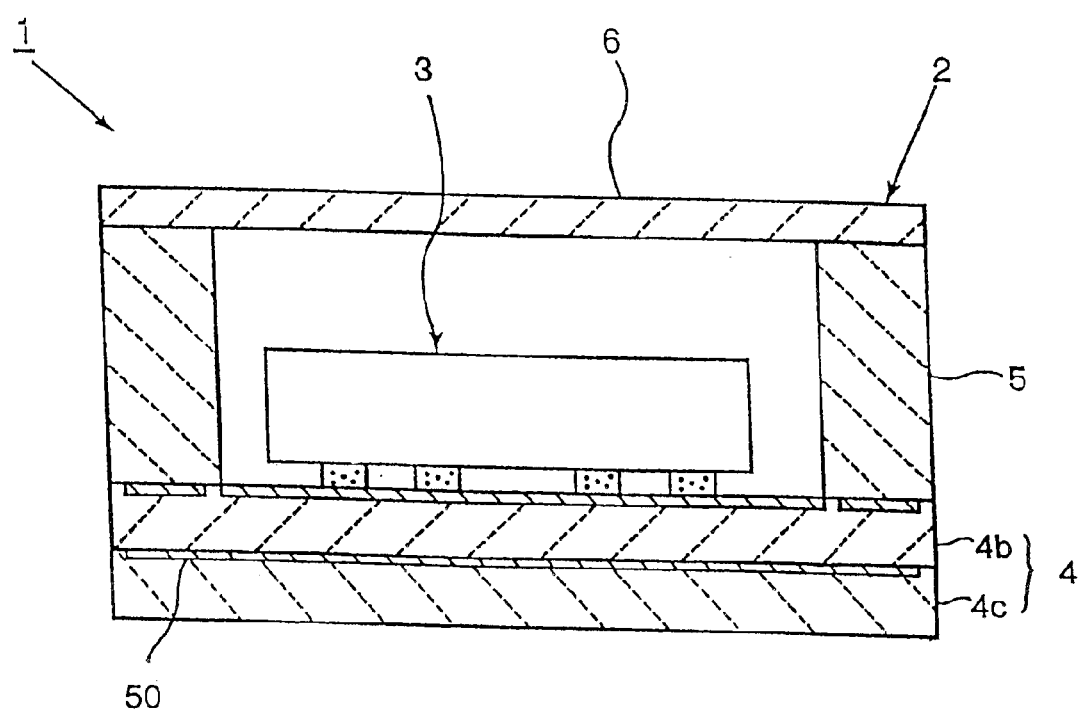
FIG. 1 is a schematic sectional view of a surface acoustic wave filter device in accordance with a first preferred embodiment of the present invention.

As shown in FIG. 1, the surface acoustic wave filter device 1 in accordance with a first preferred embodiment includes a package 2, and a surface acoustic wave filter element 3 accommodated in a package 2. FIG. 1 only schematically shows the appearance of the surface acoustic wave filter device 3.

The package 2 includes a base board 4 having a substantially rectangular plate shape, a substantially rectangular frame-shaped side wall 5 bonded on the base board 4, and a substantially rectangular plate-shaped cap member 6 affixed to the side wall 5 so as to close the upper opening thereof. Alternatively, the side wall 5 may have a ring-shaped structure such as a substantially annular shape.

The base board 4 and the side wall 5 are preferably made of an insulative ceramic such as alumina or a synthetic resin, or other suitable material. The cap member 6 is also preferably made of an insulative ceramic material. Alternatively, the cap member 6 may be made of a metal or other suitable having an electromagnetic shielding property.

The base board 4 is defined by a multilayer substrate including substrates 4$b$ and 4$c$. Between the substrate 4$a$ and the substrate 4$b$, a ground electrode 50 defining a microstrip line which is described later is provided on substantially an entire surface of the substrate 4$b$. The substrates 4$b$ and 4$c$ are preferably made of insulative material and have a desired dielectric constant.

Figure 2:
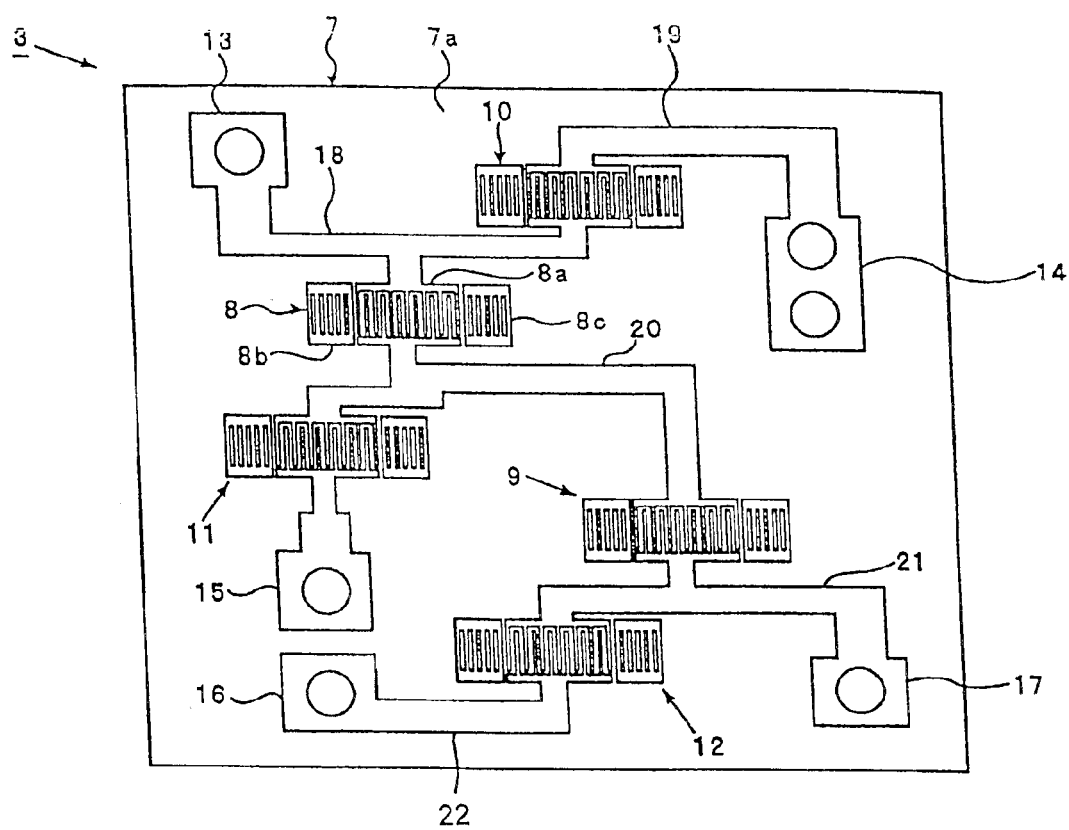
FIG. 2 is a plan view showing an electrode structure of a surface acoustic wave filter element used in the surface acoustic wave filter device in accordance with the first preferred embodiment of the present invention.

As shown in FIG. 2, the surface acoustic wave filter element 3 includes a substantially rectangular plate-shaped piezoelectric substrate 7. In this preferred embodiment, the piezoelectric substrate 7 is preferably made of a 36°, Y-cut, and X-propagation LiTaO$_3$ substrate. The piezoelectric substrate 7, however, may be made of another piezoelectric single crystal, or a piezoelectric ceramic such as lead titanate zirconate-based ceramic. Alternatively, a piezoelectric substrate including a piezoelectric thin film made of ZnO or other suitable material provided on a piezoelectric plate or an insulating substrate may be used.

A metallic film is provided over the entire top surface 7$a$ of the piezoelectric substrate 7, and then an electrode pattern shown in the figure is formed from the metallic film by photolithography and etching, or other suitable process. A metallic material for forming the electrode pattern is not particularly limited, but in this preferred embodiment, aluminum is used as a metallic material. The formation of an electrode may also be performed using the lithography and lift off method.

The above-described electrode pattern will be described with reference to FIG. 2.

On the top surface 7a of the piezoelectric substrate 7, in order to define a ladder circuit, series arm resonators 8 and 9 and parallel arm resonators 10 to 12 each of which includes one terminal pair surface acoustic wave element are provided. Each of the series arm resonators 8 and 9 and the parallel arm resonators 10 to 12 includes one IDT and reflectors disposed on opposite sides of each the IDTs in the propagation direction of a surface acoustic wave. Referring to the series arm resonator 8 as a representative example, the series arm resonator 8 includes an IDT 8a and a pair of reflectors 8b and 8c.

Also, on the top surface 7a of the piezoelectric substrate 7, electrode lands 13 to 17 are provided. Each of the electrode lands 13 to 17 defines a portion for electrically connecting the surface acoustic wave filter element 3 to the outside, and is formed of a metallic film having a desired area. Here, the substantially circular portions of the electrode lands 13 to 17 define the portions to be bonded by bumps.

The electrode land 13 defines the input end of the surface acoustic wave filter element 3, and is connected to one end of the first series arm resonator 8 via a conductive path 18. The conductive path 18 electrically connects the electrode land 13, the one end of the series arm resonator 8, and one end of the first parallel arm resonator 10. An end of the parallel arm resonator 10 which is opposite to the end thereof connected to the conductive path 18 is connected to the electrode land 14 via a conductive path 19. The electrode land 14 is connected to the ground potential.

Also, an end of the series arm resonator 8 which is opposite to the end thereof connected to the conductive path 18 is connected to a conductive path 20. The conductive path 20 is connected to one end of the second series arm resonator 9 and also to one end of the second parallel arm resonator 11. An end of the second parallel arm resonator 11 which is opposite to the end thereof connected to the conductive path 20 is connected to an electrode land 15. The electrode land 15 is connected to the ground potential.

A conductive path 21 is connected to the other end of the second series arm resonator 9. The conductive path 21 is also connected to the electrode land 17 and one end of the third parallel arm resonator 12. The electrode land 17 is used as an output terminal. An end of the parallel arm resonator 12 which is opposite to the end thereof connected to the conductive path 21 is connected to an electrode land 16 via a conductive path 22. The electrode land 16 is connected to the ground potential.

Figure 4:
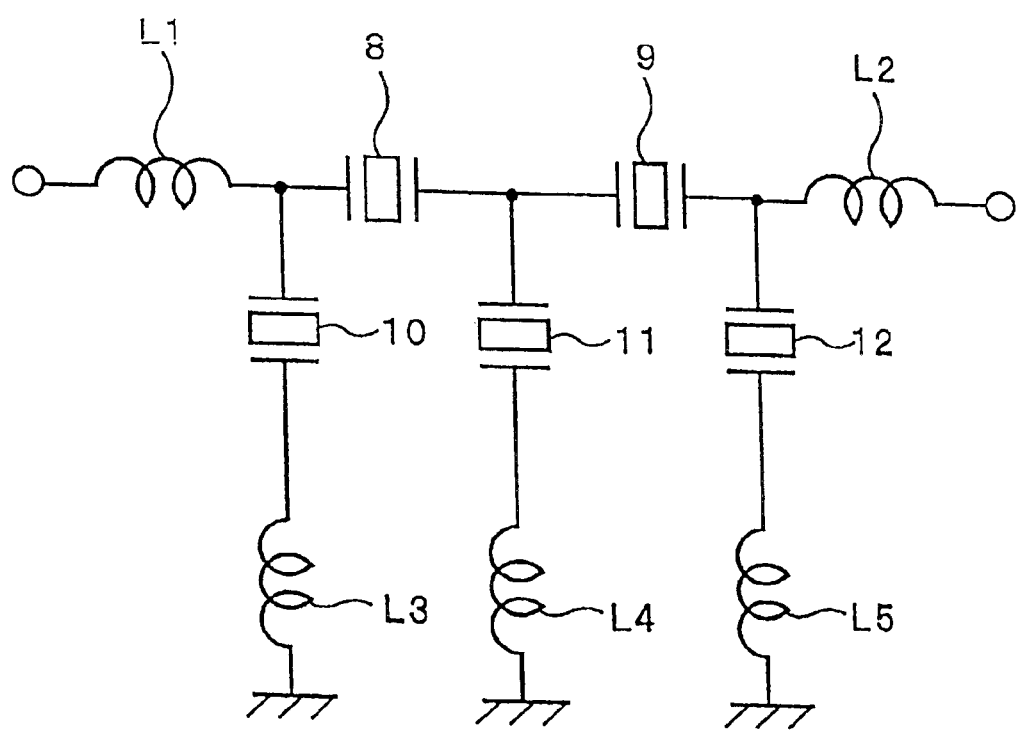
FIG. 4 is a circuit diagram of the surface acoustic wave filter device in accordance with the first preferred embodiment of the present invention.

In the surface acoustic wave filter element 3, therefore, the above-described first and second series arm resonators 8 and 9, and the first to third parallel arm resonators are connected so as to define a ladder circuit shown in FIG. 4. Meanwhile, inductances L1 to L5 in FIG. 4 will be described later.

Figure 3:
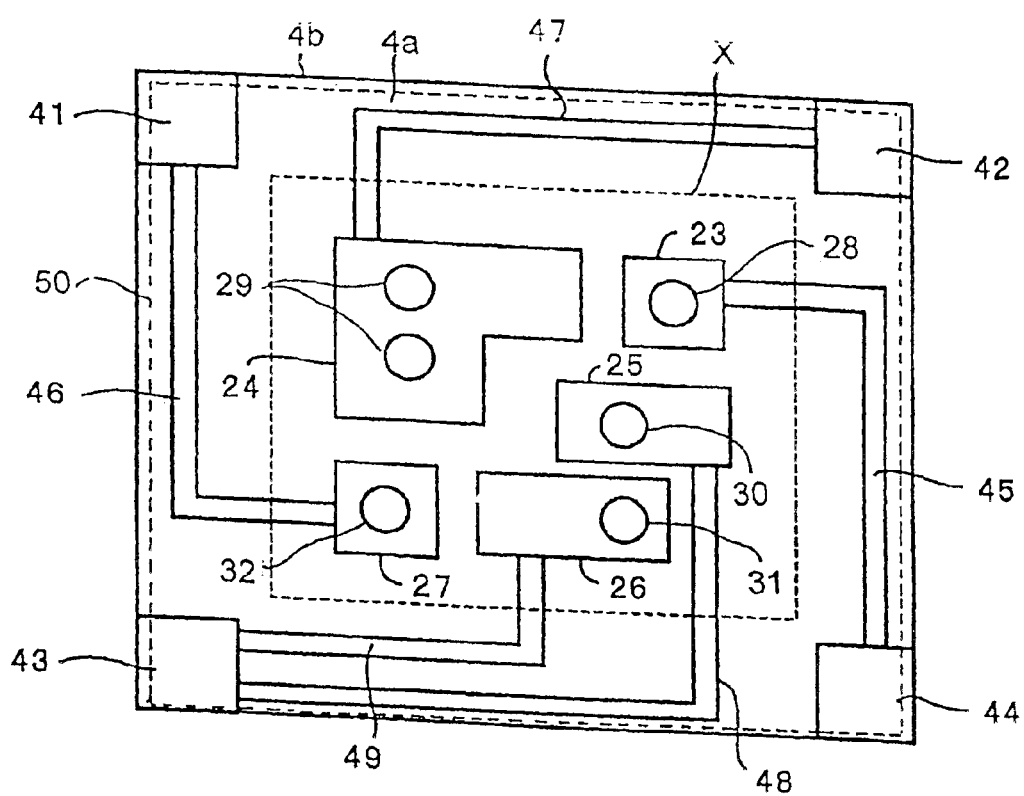
FIG. 3 is a schematic plan view showing a die-attach portion including a plurality of electrode pads on the top surface of a base board in a package of the surface acoustic wave filter device in accordance with the first preferred embodiment of the present invention.

FIG. 3 illustrates the electrode structure provided on the top surface of the base board 4 in the package 2 shown in FIG. 1.

The surface acoustic wave filter element 3 is mounted on a portion indicated by a broken line X on the top surface 4a of the base board 4. At this portion, the above-described surface acoustic wave filter element 3 is bonded by bumps such that the top surface 7a of the piezoelectric substrate 7 is arranged face down. More specifically, the surface acoustic wave filter element 3 shown in FIG. 2 is superimposed on the top surface 4a of the base board 4 shown in FIG. 3, such that the top surface 7a of the piezoelectric substrate 7 is arranged face down, and the surface acoustic wave filter element 3 and the base board 4 are bonded by bumps, thereby fixing the surface acoustic wave filter element 3.

On the top surface 4a of the base board 4, the electrodes shown in the figure are preferably formed by printing and firing electrode paste. The plurality of electrode pads 23 to 27 define a die-attach portion. The electrode pads 23 to 27 are provided separately from one another. Among these, the electrode pad 23 is electrically connected to the electrode land 13 shown in FIG. 2 and mechanically bonded thereto via a bump 28. Likewise, the electrode pads 24 to 26 are connected to the electrode lands 14 to 16 shown in FIG. 2, respectively, via bumps 29, 30, and 31. Also, the electrode pad 27 is electrically connected to the electrode land 17 shown in FIG. 2 via a bump 32.

Among the above-described electrode pads 23 to 27, the electrode pads 23 and 27 are each connected to an external signal line, while the electrode pad 24 and 26 are each connected to an external ground line.

External electrodes 41 to 44 are provided on the top surface of the base board 4. The external electrodes 41 to 44 are provided not only on the top surface 4a of the base board 4, but also to extend to the bottom surface and the side surfaces thereof, at portions which are not shown in FIG. 1. Thus, each of the external electrodes 41 to 44 electrically connecting the surface acoustic wave filter device 1 to the outside.

The external electrode 44 is connected to the electrode pad 23 via a microstrip line 45. Likewise, the external electrode 41 is connected to the electrode pad 27 via a microstrip line 46. Also, the external electrode 42 is connected to the electrode pad 24 via a microstrip line 47, and the external electrode 43 is connected to both electrode pads 25 and 26 via microstrip lines 48 and 49, respectively.

The external electrodes 42 and 43 are, therefore, each connected to an external ground line, while the external electrodes 41 and 44 are each connected to a signal line.

The above-described microstrip lines 45 to 49 are arranged opposite to the ground electrode 50 via the substrate 4b, as indicated by broken line in FIG. 3. Fine belt-shaped conductive patterns function as microstrip lines. In FIG. 3, although the ground electrode 50 is provided on a substantially entire surface of the substrate 4b, ground electrode 50 may be provided at portions opposite to the microstrip lines 45 to 49. The above-described microstrip lines 45 to 49 are located between the base board 4 and the side wall.

In this preferred embodiment, inductance components are defined by the above-described microstrip lines 45 to 49. Specifically, an inductance L1 shown in FIG. 4 is defined by the microstrip line 45, an inductance L2 is defined by the microstrip line 46, and inductances L3 to L5 are defined by the microstrip lines 47 to 49, respectively.

In other words, inductance components of the microstrip lines 47 to 49 are each connected between parallel arm resonators having a ladder circuit and the external electrodes each connected to the ground line. Likewise, inductance components of the microstrip lines 46 and 45 are each connected between series arm resonators and the external electrodes 41 and 44 each connected to the external signal line, respectively.

In this preferred embodiment, in the surface acoustic wave filter device having a ladder type filter circuit including two series arm resonators 8 and 9 and three parallel arm resonators 10 to 12, inductance components are independently added into the parallel arm resonators 10 to 12 by the above-described microstrip lines 47 to 49, respectively. This provides a greatly increased pass band width and a greatly increased attenuation value in the vicinity of pass band. This will be described based on specific experimentation.

Figure 6:
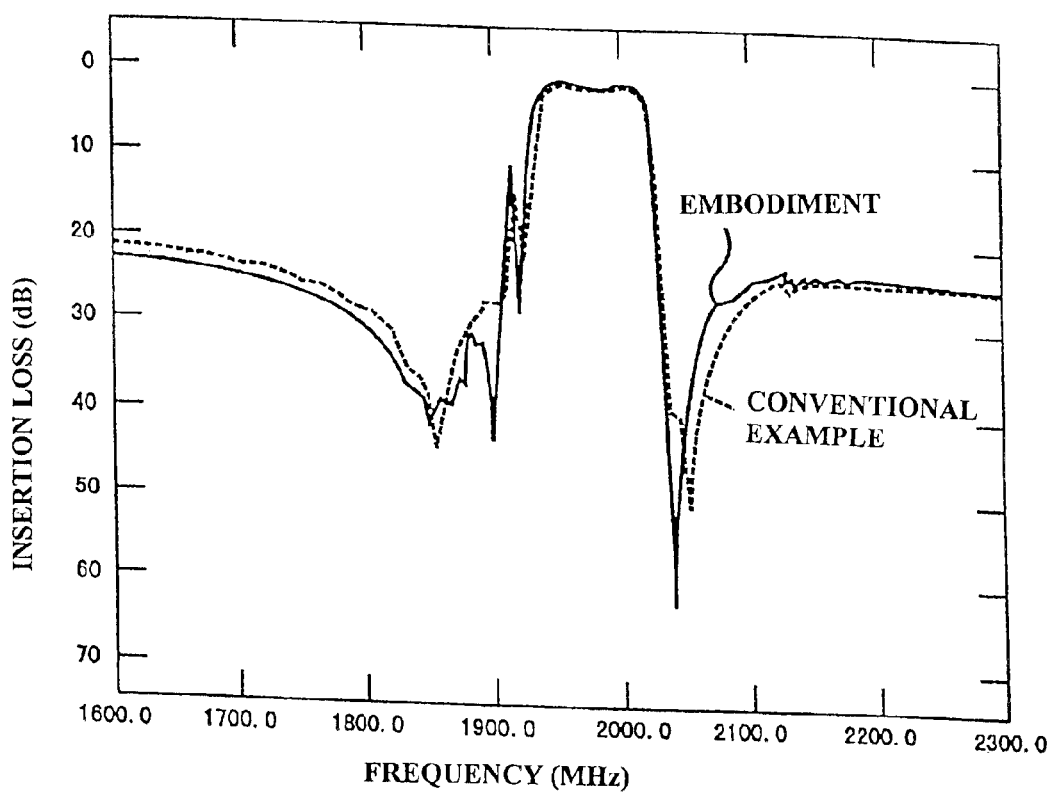
FIG. 6 is a diagram showing the attenuation value—frequency characteristics relationships in the surface acoustic wave device of the first preferred embodiment of the present invention and that of the conventional example.

The solid line in FIG. 6 shows the attenuation value—frequency characteristics relationship of the surface acoustic wave filter device in accordance with the first preferred embodiment of the present invention, and the broken line shows that of a surface acoustic wave filter device prepared for comparison.

Figure 5:
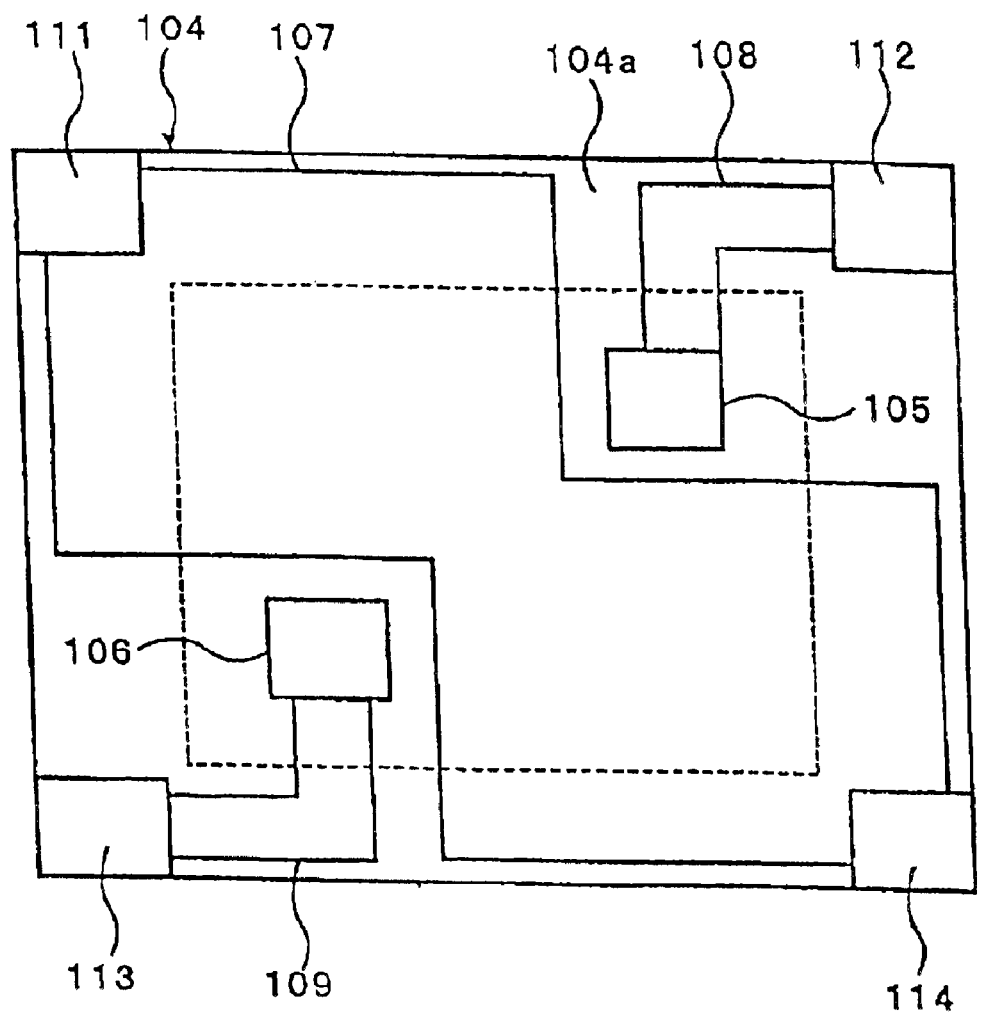
FIG. 5 is a plan view showing an electrode pattern on the top surface of the base board in the package of a conventional surface acoustic wave filter device prepared for comparison.

The conventional surface acoustic wave filter device, the results of which are shown in FIG. 6 by the broken line, is the same as that of the above-described preferred embodiment except that the electrode configuration on the top surface of the base board of the package has been provided as shown in FIG. 5. That is, electrode pads 105 to 107 are provided on the top surface 104a of a base board 104. External electrodes 111 to 114 are provided at the four corners. The external electrodes 111 to 114 are arranged so as to extend from the top surface to the bottom surface via the side surfaces thereof. These external electrodes correspond to the portions which are electrically connected to the outside. The external electrodes 112 and 113 are electrically connected to the electrode pads 105 and 106 via wide conductive paths 108 and 109, respectively.

Since ground electrodes are not provided on portions of the base board 104 which are opposite to the conductive paths 108 and 109, the conductive paths 108 and 109 do not function as microstrip lines. An electrode pad 107 having a large area is directly connected to external electrodes 111 and 114. The electrode pad 107 is bonded via bumps to the electrode lands 14 to 16 of the surface acoustic wave filter element 3 which are connected to the ground line, and the electrode pads 105 and 106 are the portions that are connected to the respective electrode lands 13 and 17 each connected to a signal terminal.

Therefore, in the conventional surface acoustic wave filter device prepared for comparison, there are no microstrip lines independently provided between the parallel arm resonators 10 to 12 and the external electrodes 111 and 114 each connected to a ground line, therefore, inductance components defined by microstrip lines are not provided therebetween.

Likewise, there are no microstrip lines connected between the series arm resonators 8 and 9 and the external electrodes 112 and 113, respectively, on the package side, therefore, inductance components by microstrip lines are not provided therebetween.

The specifications of the surface acoustic wave filter element 3 used in the above-described preferred embodiment and the conventional example are as follows:

The series arm resonators 8 and 9:
  interdigital width of electrode fingers=17 $\mu$m, number of pairs of electrodes in an IDT=100, number of electrode fingers in a reflector=100, and electrode finger pitch=0.99 $\mu$m (wavelength of surface acoustic wave $\lambda$=1.99 $\mu$m).

The first and third parallel arm resonators 10 and 12:
  interdigital width of electrode finger=50 $\mu$m, number of pairs of electrodes in an IDT=40, number of electrode fingers in a reflector=100, and electrode finger pitch=1.04 $\mu$m (wavelength of surface acoustic wave $\lambda$=2.07 $\mu$m).

The second parallel arm resonators 11:
  interdigital width of electrode finger=52 $\mu$m, number of pairs of electrodes in an IDT=90, number of electrode fingers in a reflector=100, and electrode finger pitch=1.04 $\mu$m (wavelength of surface acoustic wave$\lambda$=2.08 $\mu$m).

In the present preferred embodiment, the inductance components by the microstrip lines 45 to 49 disposed on the base board 4, are as follows:
  Microstrip lines 45 and 46 . . . 0.8 nH
  Microstrip lines 47 and 49 . . . 0.8 nH
  Microstrip line 48 . . . 0.5 nH As shown in FIG. 6, the width of the pass band corresponding to an attenuation value of 4 dB, is 86 MHz for this preferred embodiment, in contrast to 78 MHz for the conventional example, that is, this preferred embodiment exhibits a wider pass band width than the conventional example. The attenuation pole in the vicinity of the pass band, in this preferred embodiment, is located at substantially the same frequency as that in the conventional example. This is because common inductance component is provided since the electrode pads of the die-attach portion connected to the ground potential are separated from one another, in other words, since inductance components are independently added to the first to third parallel arm resonators 10 to 12 by the above-described microstrip lines 47 to 49.

Furthermore, since the microstrip lines 45 to 49 for providing the above-described inductance components are located between the base board and the side wall, minimal electromagnetic coupling between each of the microstrip lines 45 to 49 and the surface acoustic wave filter element 3 occurs, such that superior filter characteristics are achieved. In addition, since the above-described microstrip lines 45 to 49 are not provided in the die-attach portion, these microstrip lines do not impose any limitations on the location and the number of bumps. This allows the surface acoustic wave filter element 3 to be bonded to the base board 4 with greatly increased bonding strength.

Changing the dielectric constant of the substrate 4b on which the microstrip lines are provided and the distance between the microstrip lines and the ground electrode 50 makes it possible to design the inductance component per unit length of the microstrip line. Therefore, the inductance component necessary to improve the characteristics of surface acoustic wave filter arc designed and included in the surface acoustic wave filter via the inductance component of microstrip line. Further, since the microstrip line is resistant to outside influences, the inductance component of the microstrip line does not substantially change even if the surface acoustic wave filter element is attached to the base board by face down process. Therefore a desired inductance component is added to the surface acoustic wave filter.

Figure 7:
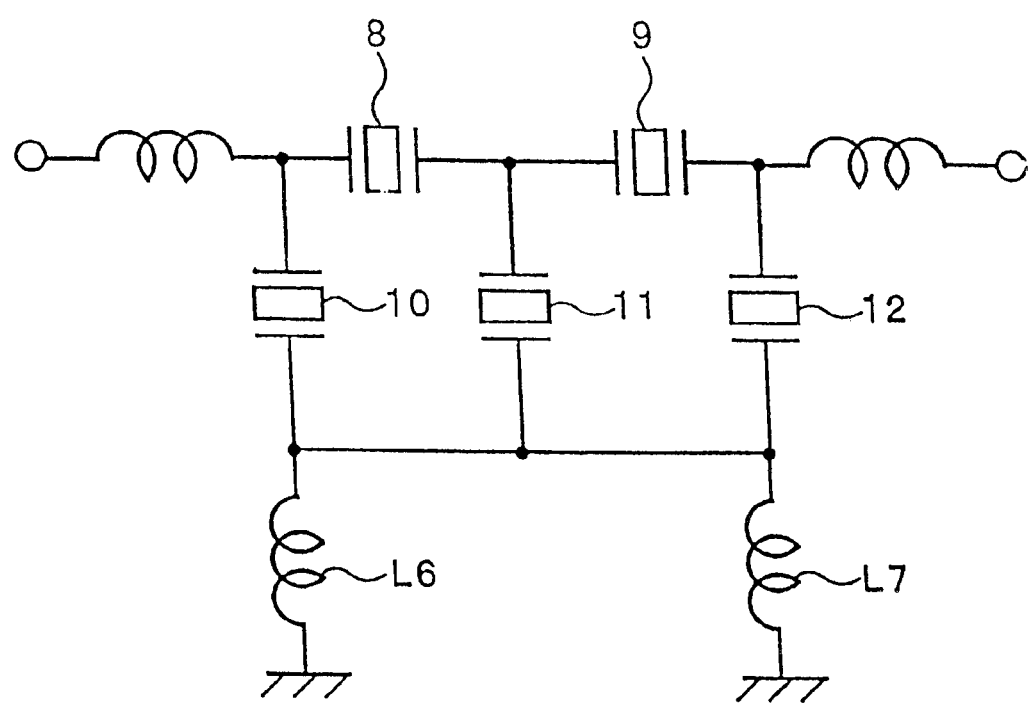
FIG. 7 is a circuit diagram of a surface acoustic wave filter device in accordance with a second preferred embodiment of the present invention.

FIG. 7 is a diagram showing the circuit configuration of a surface acoustic wave filter device in accordance with a second preferred embodiment of the present invention.

In this preferred embodiment, a surface acoustic wave filter element 3 similar to that in accordance with the first preferred embodiment, is provided. As shown in FIG. 7, two series arm resonators 8 and 9, and three parallel arm resonators 10 to 12 are connected to one another so as to have a ladder circuit configuration.

As seen from FIG. 7, however, in this preferred embodiment, the ends of the three parallel arm resonators 10 to 12 connected to the ground potential are commonly connected, and inductances L6 and L7 are connected between this commonly connected portion and the external electrodes which are each connected to an external ground line. Here, the ends of the three parallel arm resonators 10 to 12 connected to the ground potential, that is, the ground terminals are commonly connected on the piezoelectric substrate.

Each of the above-described inductances L6 and L7 is defined by a microstrip line provided in the package.

Figure 8:
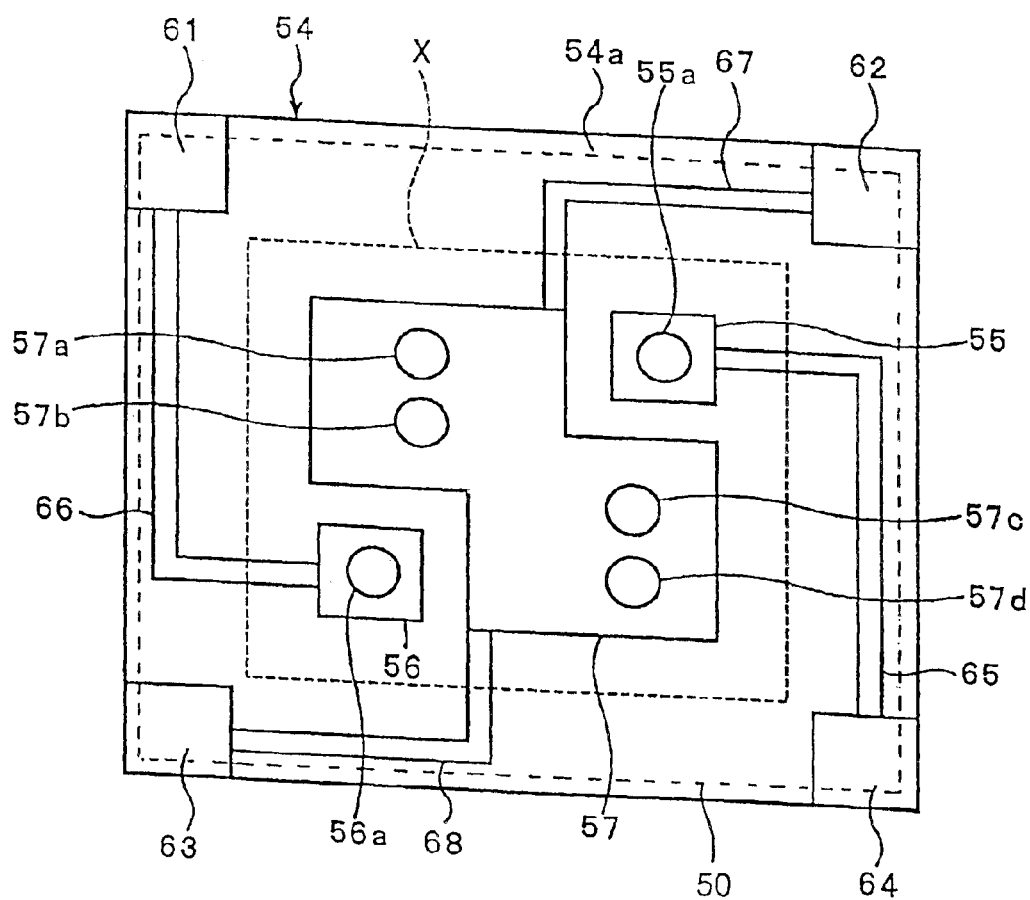
FIG. 8 is a plan view showing an electrode structure on the top surface of a base board in a package used in a surface acoustic wave filter device in accordance with the second preferred embodiment of the present invention.

FIG. 8 is a plan view showing the electrode structure on the top surface of the base board 54 in the package used in the second preferred embodiment of the present invention.

The second preferred embodiment is preferably constructed in the same manner as the first preferred embodiment except that the electrode structure on the top surface of the base board 54 of the second preferred embodiment differs from that in the first preferred embodiment. Hence, regarding the structure of the surface acoustic wave filter element 3 and other structures of the package 2, the description of the first preferred embodiment will be referred to.

In this preferred embodiment, the surface acoustic wave filter element 3 is bonded via bumps via the face down process, such that the top surface 4a (see FIG. 2) of the piezoelectric substrate 4 is arranged face down on the area surrounded by broken line X on the top surface of the base board 54.

A die-attach portion including electrode pads 55 to 57 is provided on the top surface 54a of the base board 54. The electrode pads 55 and 56 are bonded to the electrode lands 13 and 17 shown in FIG. 2 via bumps 55a and 56a, respectively. The electrode pad 57 is bonded to the electrode lands 14, 15, and 16 connected to the ground potentials shown in FIG. 2, via bumps 57a to 57d.

As in the first preferred embodiment, external electrodes 61 to 64 are provided at the corner portions of the base board 54. The external electrodes 61 to 64 are provided not only on the top surface 54a of the base board 54, but also so as to extend to the bottom surface via the side surfaces thereof. The above-described electrode pads 55 and 56 are connected to the external electrodes 64 and 61 via microstrip lines 65 and 66, respectively. The electrode pad 57 is connected to the external electrodes 62 and 63 via the respective microstrip lines 67 and 68.

That is, the terminals of the three parallel arm resonators connected to the ground potential via the electrode pad 57 in the die-attach portion of the package 2 are commonly connected, and the electrode pad 57 is connected to different external electrodes 62 and 63 via the respective microstrip lines 67 and 68.

The electrode lands 13 and 17 defining input/output signal terminals and the electrode lands 14 to 16 defining ground terminals on the piezoelectric substrate 4, are arranged so as to be rotated by approximately 90° with respect to the normal line passing the approximate center of the piezoelectric substrate 4, with respect to the external electrodes 61 and 64 each connected to the signal line and the external electrodes 62 and 63 each connected to the ground line outside the package.

Similar to the first preferred embodiment, the microstrip lines 65, 66, 67 and 68 are opposite to the ground electrode 50. Other elements of the second preferred embodiment are the same as those of the first preferred embodiment.

Figure 9:
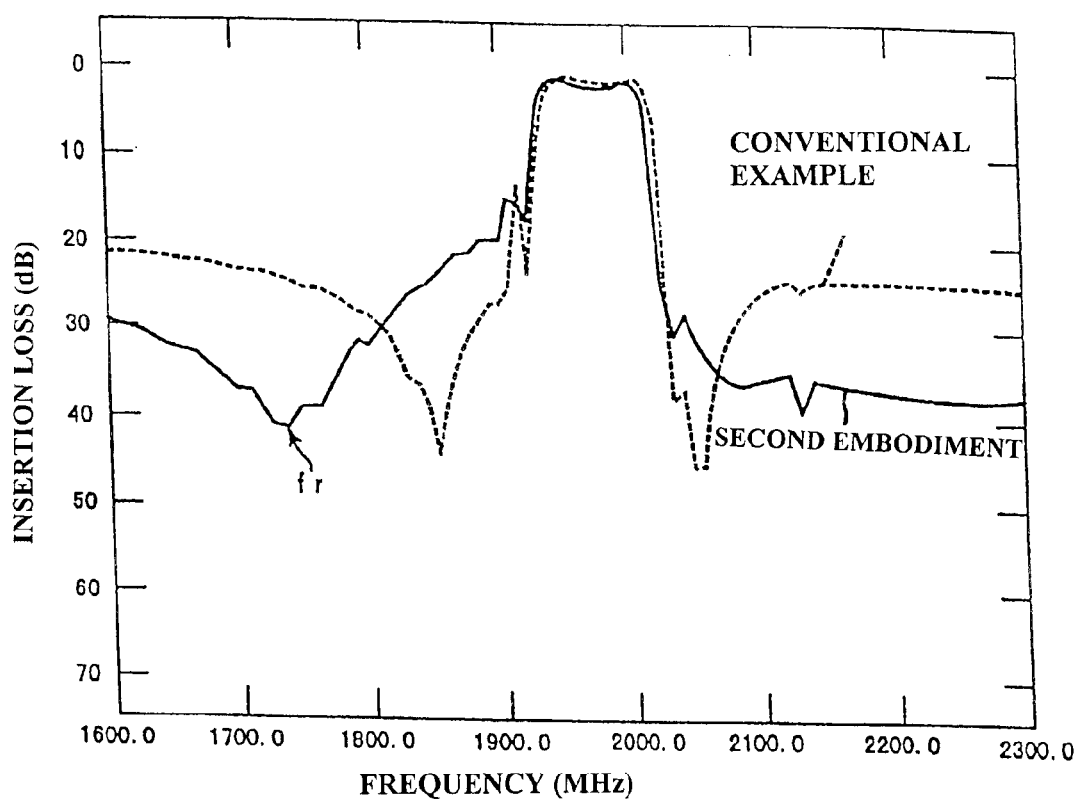
FIG. 9 is a diagram showing the attenuation value—frequency characteristics relationships in the surface acoustic wave filter device of the second preferred embodiment of the present invention and that of the conventional example.

The attenuation value—frequency characteristics relationship of the surface acoustic wave filter device in accordance with the second preferred embodiment is indicated by a solid line in FIG. 9. For comparison, the attenuation value—frequency characteristics relationship of the surface acoustic wave filter device in accordance with a conventional example prepared similar to the comparative example used in the first preferred embodiment, is indicated by a broken line.

In the second preferred embodiment, each of the inductance components provided by the microstrip lines 65 and 66 is about 0.8 nH, and each of the inductance components added by the microstrip lines 67 and 68 is about 0.3 nH.

Actually, however, a common inductance of about 0.1 nH is inserted, since the microstrip lines 67 and 68 connected to the external electrodes 62 and 63, that are each connected to an external ground line, are connected in parallel with the external ground lines.

As shown in FIG. 9, in this preferred embodiment, since inductance components are provided in the package 2 via the above-described microstrip lines 65 to 68, the attenuation value in the vicinity of the pass band is greatly increased. The width of the pass band corresponding to an attenuation value of about 4 dB, is about 80 MHz for this preferred embodiment, in contrast to 78 MHz for the conventional example, that is, the pass band width is simultaneously increased in this preferred embodiment.

In this preferred embodiment also, since microstrip lines for adding inductances are provided between the base board 4 and the annular side wall 5, the electromagnetic coupling with the surface acoustic wave filter element is greatly reduced, thereby providing greatly improved filter characteristics. Furthermore, as in the case of the first preferred embodiment, in this preferred embodiment, since no microstrip lines are provided in the die-attach portion, there are no limitations on the position and the number of bumps. This enables the surface acoustic wave filter element 3 to be securely bonded to the base board 4.

Figure 10:
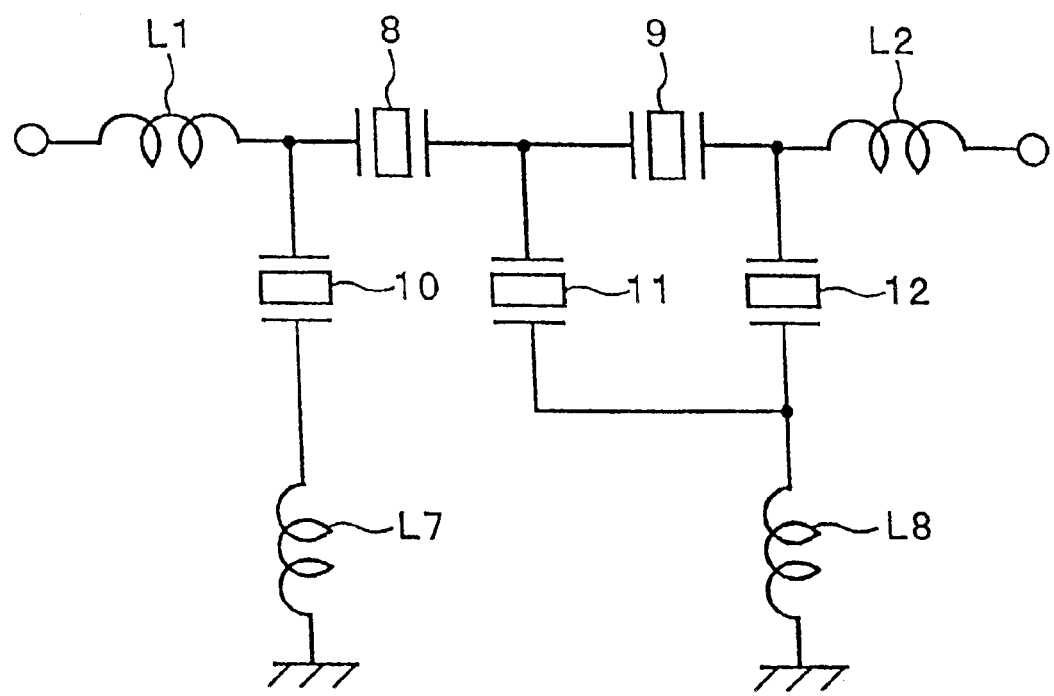
FIG. 10 is a circuit diagram of a surface acoustic wave filter device in accordance with a third preferred embodiment of the present invention.

FIG. 10 is a diagram showing the circuit configuration of a surface acoustic wave filter device in accordance with a third preferred embodiment of the present invention. In the third preferred embodiment, the surface acoustic wave filter element 3 is constructed in a similar manner as the first preferred embodiment, and two series arm resonators 8 and 9 and three parallel arm resonators 10 to 12 are connected to one another so as to define a ladder circuit.

Figure 11:
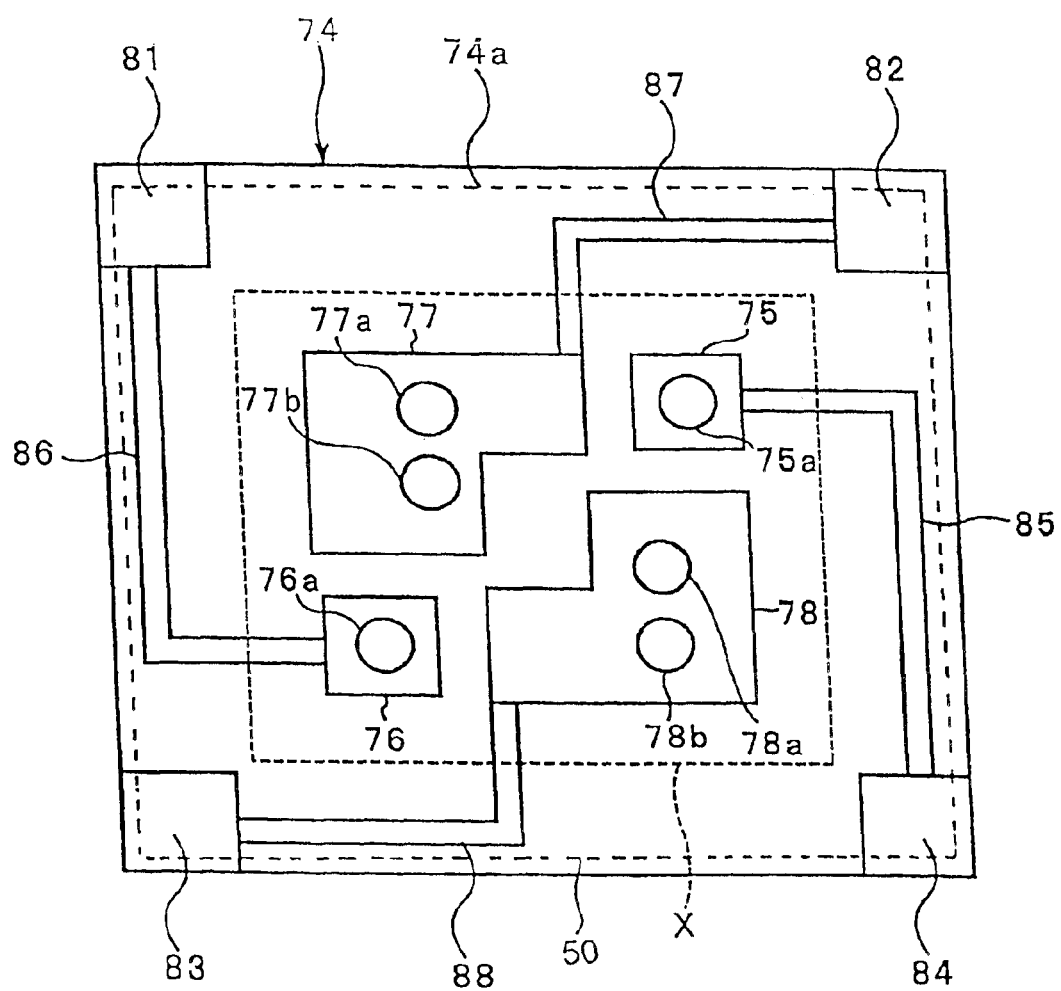
FIG. 11 is a plan view showing an electrode structure on the top surface of a base board in a package used in a surface acoustic wave filter device in accordance with the third preferred embodiment of the present invention.

In this preferred embodiment, the side wall and the cap member of the package 2 are constructed in a similar manner as those of the first preferred embodiment. The difference between the third and first preferred embodiments is in the electrode structure provided on the base board 74, as shown in FIG. 11. Hence, regarding elements other than the electrode structure on the base board 74, descriptions thereof will be described with reference to the description of the first preferred embodiment.

On the top surface 74a of the base board 74, a plurality of electrode pads 75, 76, 77, and 78 are provided, and a die-attach portion is defined by the plurality of electrode pads 75 to 78. The portion indicated by a circle or circles inside each of the electrode pads 75 to 78 define the locations of the bumps when the surface acoustic wave filter element 3 is bonded via the face down mounting process.

External electrodes 81 to 84 are provided at the corners of the base board 74, in a similar manner to the first preferred embodiment. The external electrodes 81 and 84 are each connected to a signal line, and are connected to the electrode pads 76 and 75 via microstrip lines 86 and 85. The electrode pads 77 and 78 are connected to the external electrode 82 and 83 which are each connected to a ground line, via microstrip lines 87 and 88.

Also, the electrode pad 75 is connected to the electrode lands 13 shown in FIG. 2 via a bump 75a, and the electrode pad 76 is connected to the electrode land 17 shown in FIG. 2 via a bump 76a. The electrode pad 77 is connected to the electrode lands 14 (FIG. 2) via bumps 77a and 77b, and the electrode pad 78 is connected to the electrode lands 15 and 16 (see FIG. 2) via bumps 78a and 78b. Herein, ground terminals of at least two parallel arm resonators may be connected to one electrode land. In other words, electrode lands connected to the ground potential, for example, the electrode lands 15 and 16 are defined by a common land.

As shown in FIG. 10, therefore, the first parallel arm resonator 10 and the second and third resonators 11 and 12 are separated from each other in the die-attach portion. An inductance L7 defined by the microstrip line 87 is provided between the first parallel arm resonator 10 and the external electrode 82 connected to an external ground line, and an inductance L8 defined by the microstrip line 88 is provided between the second and third parallel arm resonators 11 and 12 and the external electrode 83 that is connected to a ground line.

Figure 12:
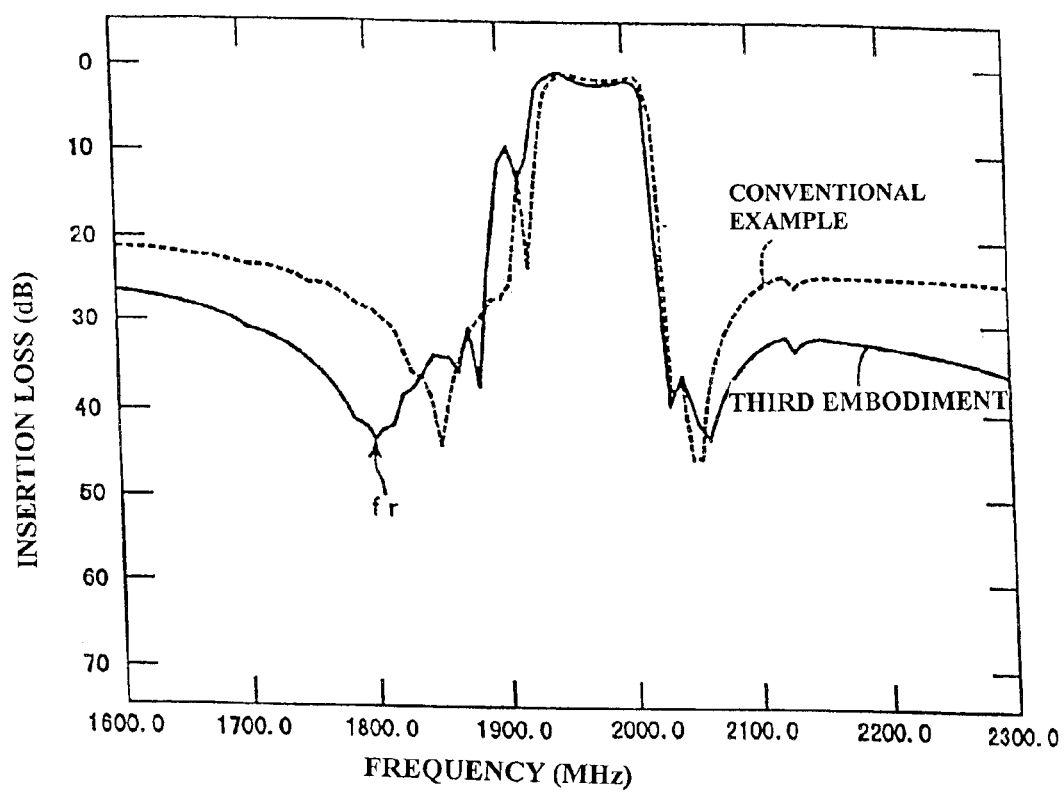
FIG. 12 is a diagram showing the attenuation value—frequency characteristics relationships in the surface acoustic wave filter device of the third preferred embodiment f the present invention and that of the conventional example.

The attenuation value - frequency characteristics relationship of the surface acoustic wave filter device in accordance with the third preferred embodiment is shown in FIG. 12 using a solid line. For comparison, the attenuation value—frequency characteristics relationship of the surface acoustic wave filter device in accordance with the conventional example prepared for comparison similar to the first preferred embodiment, is shown in FIG. 12 using a broken line.

In this case, each of the inductance components by the microstrip lines 85 and 86 was about 0.8 nH, and each of the inductance components defined by the microstrip lines 87 and 88 was about 0.3 nH. Other elements of this preferred embodiment are similar to those of the first preferred embodiment.

As shown in FIG. 12, in this preferred embodiment, the attenuation value in the vicinity of the pass band is significantly increased over the conventional example, since inductance components are provided in the package 2 by the above-described microstrip lines 85 to 88. The width of the pass band corresponding to an attenuation value of about 4 dB, is about 85 MHz for this preferred embodiment, in contrast to 78 MHz for the conventional example, that is, the width of the pass band is greatly increased in this preferred embodiment.

As compared with the frequency characteristics (FIG. 9) of the second preferred embodiment, in this preferred embodiment, the frequency at the attenuation pole fr in the vicinity of the pass band is increased. Therefore, when an increase in the attenuation value in the frequency range nearer to the pass band is required, the surface acoustic wave filter device in accordance with the third preferred embodiment is more advantageous than that in accordance with the second preferred embodiment.

Figure 13:
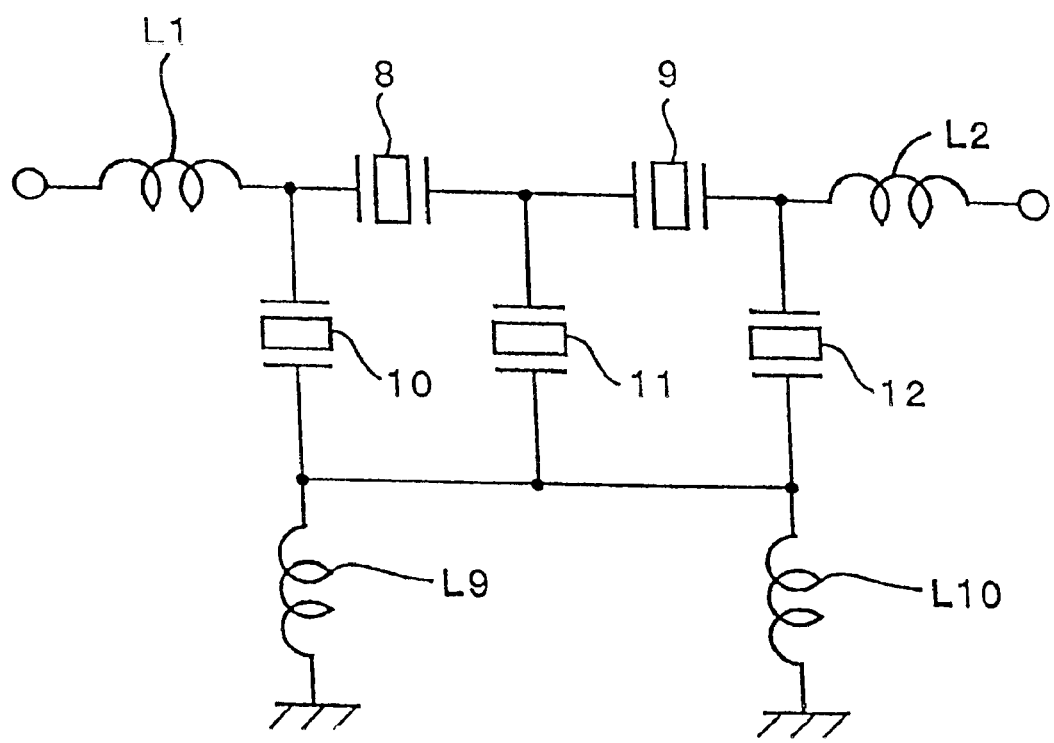
FIG. 13 is a circuit diagram of a surface acoustic wave filter device in accordance with a fourth preferred embodiment of the present invention.

FIG. 13 is a diagram showing the circuit configuration of a surface acoustic wave filter device in accordance with a fourth preferred embodiment of the present invention. In the fourth preferred embodiment, the same surface acoustic wave filter element 3 in accordance with the first preferred embodiment is used, and first and second series arm resonators 8 and 9 and parallel arm resonators 10 to 12 are connected to one another so as to define a ladder circuit.

Figure 14:
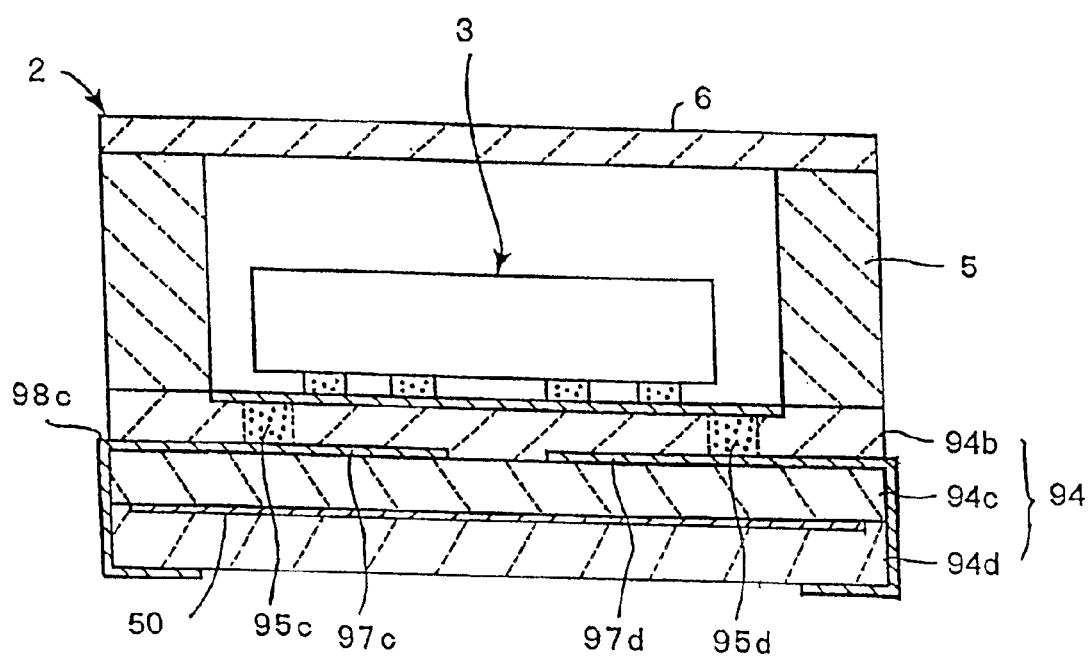
FIG. 14 is a schematic sectional view of a surface acoustic wave filter device in accordance with the fourth preferred embodiment of the present invention.

As shown in FIG. 14, a package 2 includes a base board 94 defining a first case member. Also, a second case member including a side wall 95 and a cap 96, is constructed as in the same manner as that in the first preferred embodiment.

In this preferred embodiment, the base board 94 is constructed by a laminated ceramic board including substrates 94*b*, 94*c* and 94*d*, and within the base board 94, microstrip lines for adding inductances as described later are provided.

Figure 15:
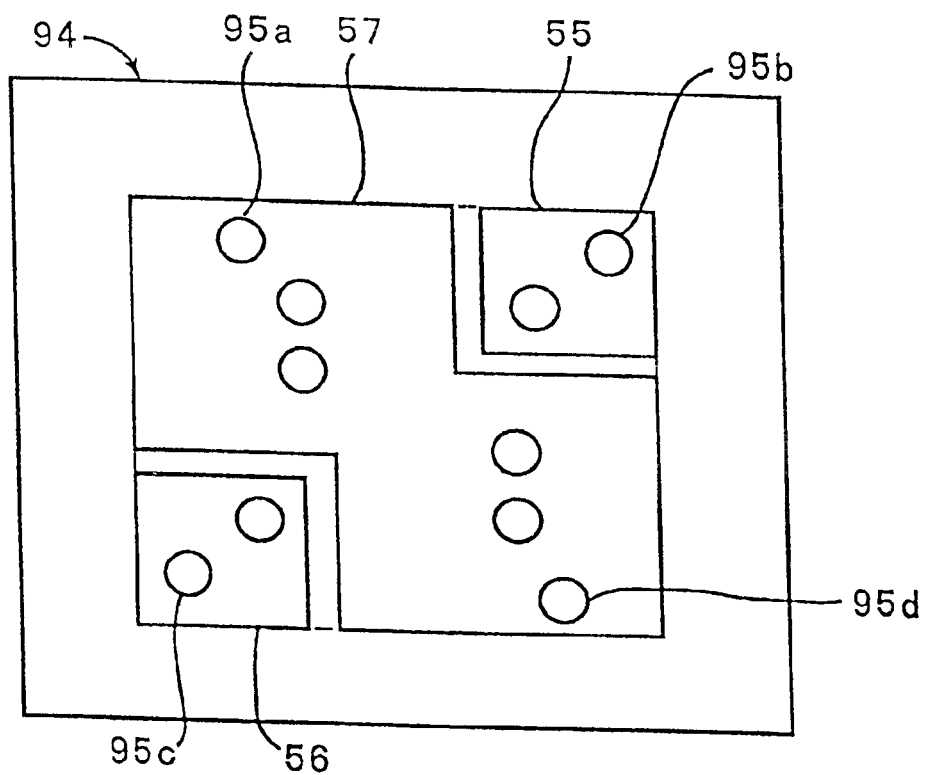
FIG. 15 is a plan view showing an electrode structure on the top surface of a base board in a package used in a surface acoustic wave filter device in accordance with the fourth preferred embodiment of the present invention.
Figure 16:
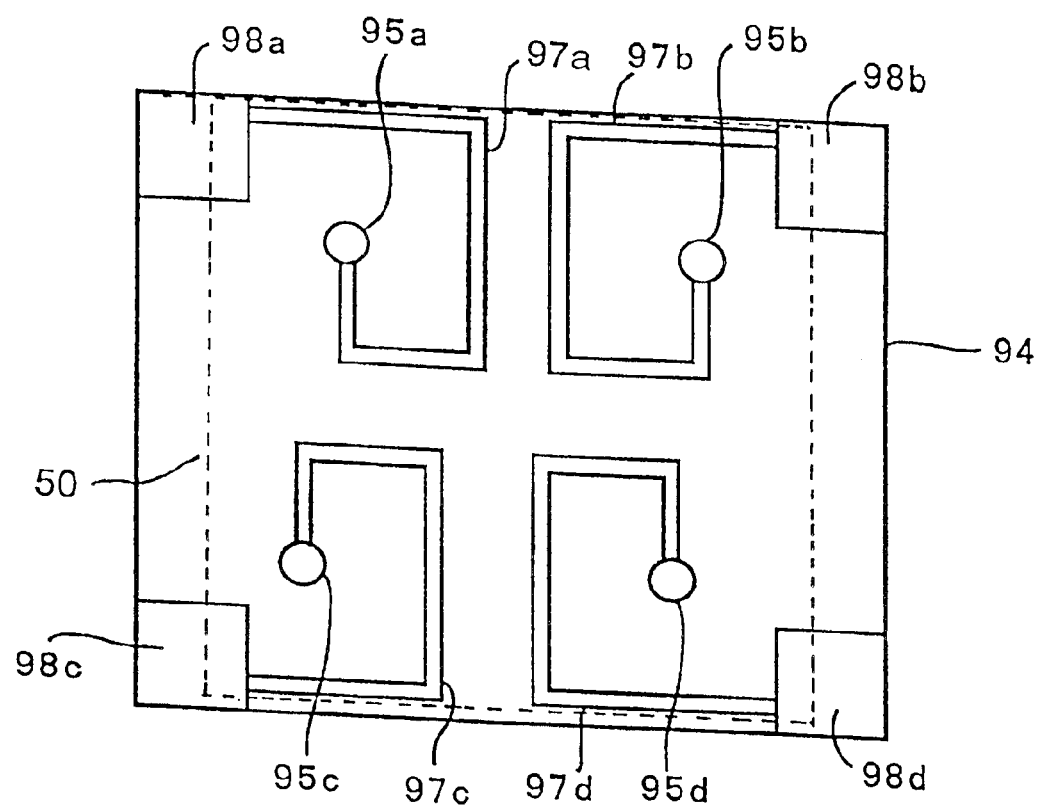
FIG. 16 is a plan view showing the electrode structure within the base board in the package used in the surface acoustic wave filter device in accordance with the fourth preferred embodiment of the present invention.

FIG. 15 is a plan view showing a top surface of the base board 94 and a top surface of the substrate 94*b*, and FIG. 16 is a plan view showing a top surface of the substrate 94*c* where microstrip lines are provided.

As shown in FIG. 15, electrode pads 55 to 57 are provided on the top surface of the base board 94, in a similar manner as the base board in the second preferred embodiment shown in FIG. 8. In this preferred embodiment, however, no external electrode and microstrip line are provided on the top surface of the base board 94, and instead, are provided inside the base substrate 94. Through hole electrodes 95*a* to 95*d* penetrating through the substrate 94*b* and extending to the bottom surface thereof are provided at locations of the electrode pads 55 to 57. As shown in FIG. 16 the lower ends of the through hole electrodes 95*a* to 95*d* are connected to one-side end of the microstrip lines 97*a* to 97*d* provided on the upper surface of the substrate 94*c*, respectively. The other ends of the microstrip lines 97*a* to 97*d* are connected to the external electrodes 98*a* to 98*d* on the upper surface of the substrate 94*c*, respectively. The external electrodes 98*a* to 98*d* are arranged so as to extend from the corner portions to the bottom surface of the base board 94 to the side surfaces of the substrates 94*c* and 94*d* (see FIG. 14). Further, as indicated by broken line in FIG. 16, the ground electrode 50 for microstrip lines 97*a* to 97*d* is arranged to cover the substantially entire bottom surface of the substrate 94*c*.

More specifically, in this preferred embodiment, the microstrip lines 97*a* to 97*d* are embedded in the base board 94, and via these microstrip lines 97*a* to 97*d*, as shown in FIG. 13, inductance components L9 and L10 are defined between the portion where the first to third parallel arm resonators are commonly connected, and the external electrodes each connected to an external ground line, while inductance components L1 and L2 are defined between the series arm resonators 8 and 9 and the external electrodes each connected to an external signal line.

In this manner, the microstrip lines for adding inductances can be provided at any location within the package.

Figure 17:
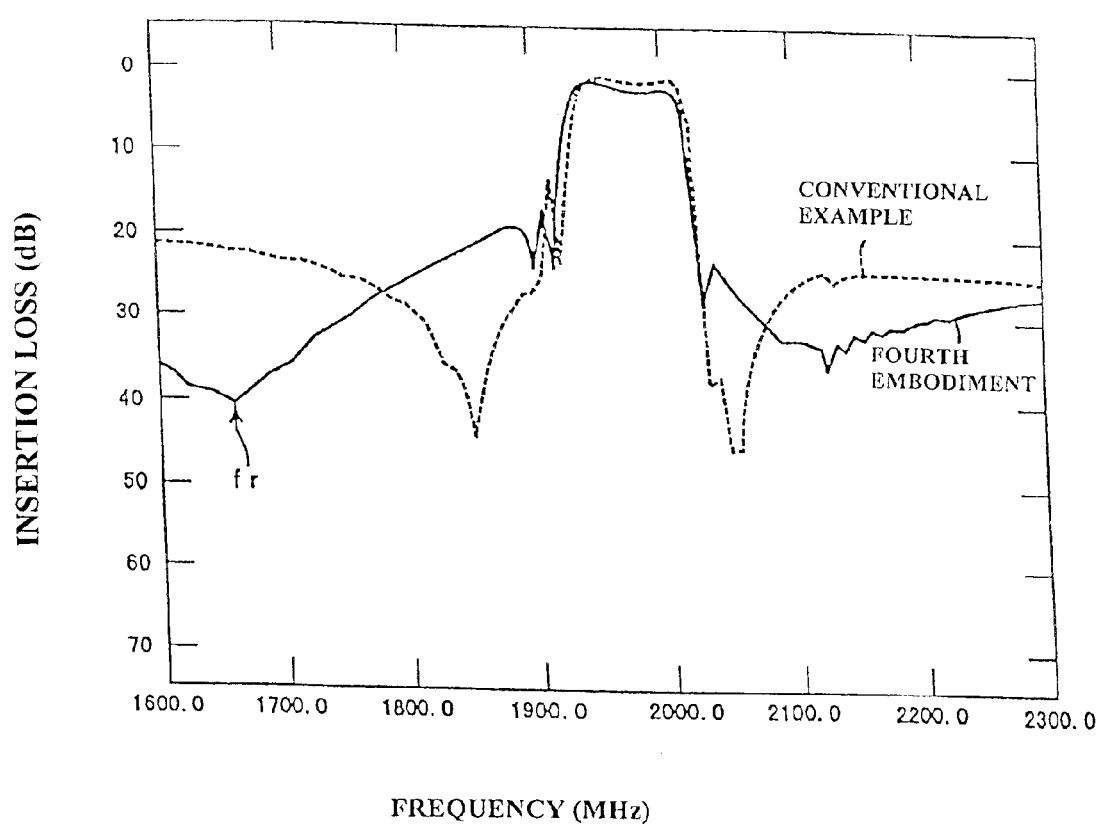
FIG. 17 is a diagram showing the attenuation value—frequency characteristics relationships in the surface acoustic wave filter device of the fourth preferred embodiment and that of the conventional example.
Figure 18:
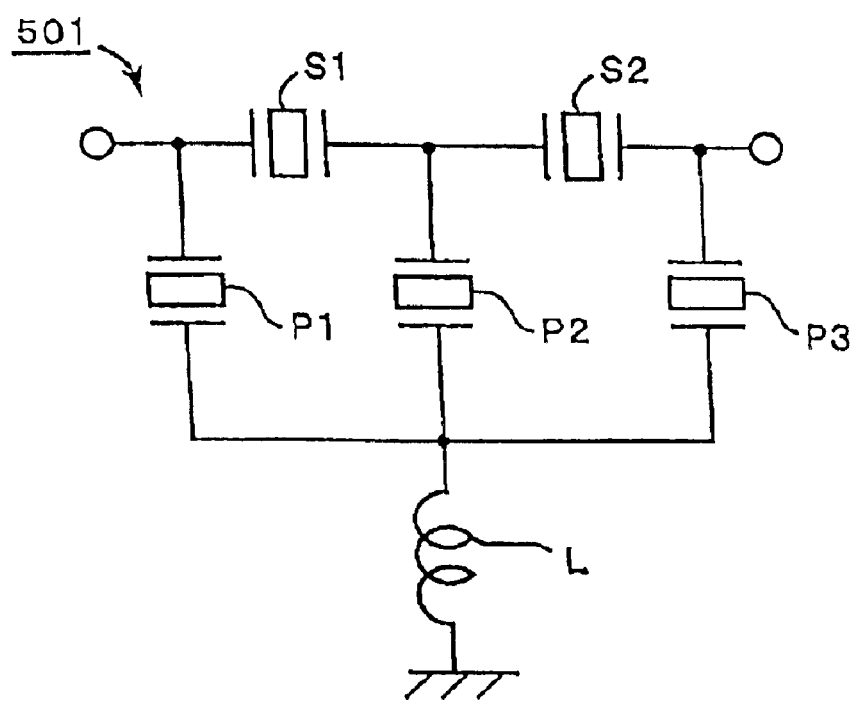
FIG. 18 is a circuit diagram showing an example of a surface acoustic wave filter device having a conventional ladder type circuit
Figure 19:
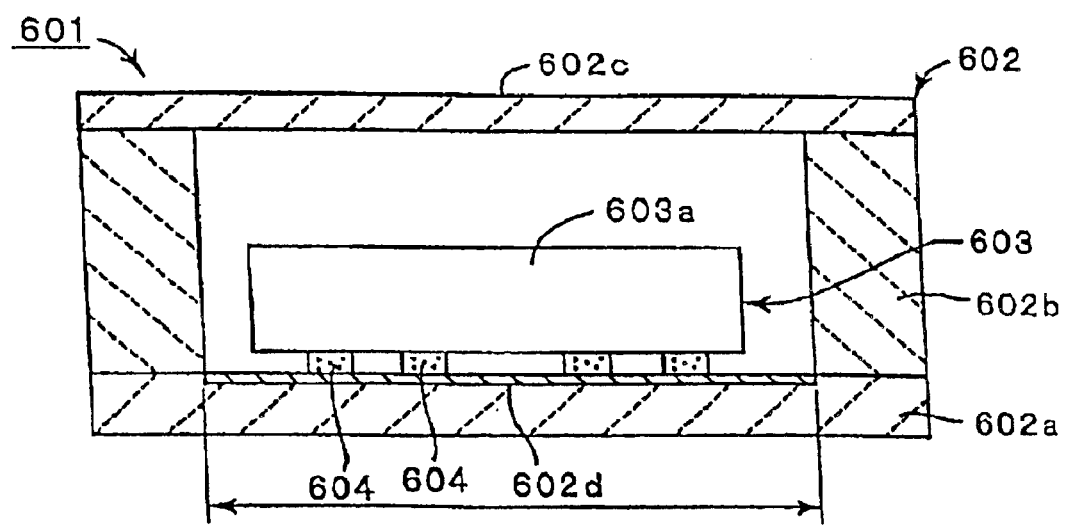
FIG. 19 is a sectional view showing another example of a conventional surface acoustic wave filter device.

The solid line in FIG. 17 shows the attenuation value—frequency characteristics relationship of the surface acoustic wave filter device in accordance with the fourth preferred embodiment, and the broken line shows the attenuation value—frequency characteristics relationship of the surface acoustic wave filter device in accordance with the conventional example prepared for comparison. Here, in the surface acoustic wave filter device in accordance with the fourth preferred embodiment, the inductance component defined by a microstrip line included for each of the series arm resonators was about 1.0 nH, and the inductance components L9 and L10 each connected between the parallel arm resonator and the ground line was about 1.0 nH.

As shown in FIG. 17, in this preferred embodiment, microstrip lines for adding inductance components greatly increases the attenuation value in the vicinity of the pass band. In particular, the improvement in the attenuation value on the lower frequency side is significant. This is because the frequency fr of the attenuation pole is reduced because the value of the inductances L8 and L9 connected in parallel with each other are increased.

In the fourth preferred embodiment, since the microstrip lines are embedded in the base board, that is, since the microstrip lines are provided as internal electrodes, each of the microstrip lines is lengthened, thereby providing an increased inductance value. In order to obtain an even larger inductance value, it is preferable to lengthen a microstrip line by providing a plurality of layers of microstrip lines, and electrically connecting the plurality of microstrip lines with one another via a through hole electrode or a via hole electrode.

As described above, in the surface acoustic wave filter device in accordance with preferred embodiments of the present invention, since inductance components defined by microstrip lines are each connected to any of the series arm resonators and parallel arm resonators defining a ladder circuit, and the microstrip lines are arranged in the package, the attenuation value in the vicinity of the pass band is greatly increased and wide-band filter characteristics are achieved.

Changing the dielectric constant of the substrate on which the microstrip lines are provided, and the distance between the microstrip lines and the ground electrode makes it possible to design the inductance component per unit length of the microstrip line. Therefore, inductance components necessary to improve the characteristics of surface acoustic wave filter arc easily designed and provided in the surface acoustic wave filter via the microstrip line. Further, since the microstrip line is resistant to the influence from outside, the inductance component of the microstrip line is not substantially changes even when the surface acoustic wave filter element is attached to the base board via the face down mounting process. Therefore, a desired inductance component is added to the surface acoustic wave filter.

When the package includes a die-attach portion having a plurality of electrode pads each of which is connected to any one of the signal terminals and any one of the ground terminals of the surface acoustic wave filter element via bumps, and a plurality of external electrodes each of which is electrically connected to any one of the electrode pads, and each of which is connected to a signal line or a ground line outside the surface acoustic wave filter device, the surface acoustic wave filter element is securely connected and mechanically bonded to the plurality of electrode pads using bumps via face down mounting process. The present invention, therefore, provides a wide-band filter device having a greatly increased attenuation value outside the pass band.

When each of the microstrip lines is connected between the electrode pad connected to the signal terminal of the series arm resonator and the external electrode connected to the signal line outside the surface acoustic wave filter device, since each of the microstrip lines is connected between the series arm resonator and the signal line, the reflection loss is greatly reduced and the width of the pass band is greatly increased.

When each of the above-described microstrip lines is provided between the electrode pad which is connected to the ground terminal of at least one parallel arm resonator via the bumps, and the external electrode which is connected to the ground line outside the package, the increase in attenuation value in the vicinity of the pass band and wide-band filter characteristics arc achieved.

When the surface acoustic wave filter device includes at least two parallel arm resonators, wherein the ground terminals of all the parallel arm resonators are commonly connected, on the piezoelectric substrate, wherein each of the microstrip lines is connected between the portion where the ground terminals of the parallel arm resonators are commonly connected, and each of the external electrodes provided in the package, the attenuation value can be increased at lower frequency range.

Likewise, when the package-side electrode pads connected to the ground terminals of all the parallel arm resonators are defined by a common electrode pad, and each of the microstrip lines is provided on the path between the common electrode pad and each of the external electrodes, the attenuation value is increased at lower frequency range, as well. In addition, defining the electrode pads as a common pad on the package side facilitates the wiring of chips.

When the surface acoustic wave filter includes at least three parallel arm resonators, wherein microstrip lines are provided on the path between the electrode lands to which the ground terminals of at least two parallel arm resonators are connected, and the external electrodes to which these electrode lands are connected, and wherein the parallel arm resonators other than the above-described at least two parallel arm resonators are, on the piezoelectric substrate, electrically isolated from the above-described at least two parallel arm resonators, the width of the pass band is further increased while simultaneously increasing the attenuation value in the vicinity of the pass band.

When the surface acoustic wave filter device includes at least three parallel arm resonators, and a common electrode pad connected to the ground terminals of at least two parallel arm resonators among the parallel arm resonators, wherein each of the microstrip lines is provided on the path between the common electrode pad and the external electrodes to which the common electrode pad is connected, and wherein the other parallel arm resonators are electrically isolated from the above-described at least two parallel arm resonators, at a die-attach portion including a plurality of electrode pads, the attenuation value in the vicinity of the pass band is further increased, and wideband filter characteristics are achieved.

When the microstrip lines are disposed, in the package, at the positions other than the position of the die-attach portion, the electromagnetic interference with the surface acoustic wave filter element, and consequently, the deterioration of filter characteristics is prevented.

When the package includes a base board, an annular side wall provided on the base board, and a cap member affixed to the annual side wall so as to close the upper end thereof, wherein the main portion of each of the microstrip lines is disposed between the side wall and the base board, no extra space is required, such that filter characteristics are greatly improved without increasing the size of the package.

When the package includes the first case member on which the surface acoustic wave filter element is mounted, and the second case member enclosing the surface acoustic wave filter element mounted on the first case member, wherein the main portion of each of the microstrip lines is provided inside the first case member, large inductance components can be provided, resulting in significantly improved filter characteristics.

When the signal terminals at the input/output ends of the surface acoustic wave filter element and at least one ground terminal thereof are arranged so as to be rotated by 90° around the imaginary line which passes the approximate center of the piezoelectric substrate of the surface acoustic wave filter element, and which is substantially perpendicular to the piezoelectric substrate, with respect to the external electrodes connected to the input/output end signal lines and at least one external electrode connected to the ground potential among the plurality of external electrodes, increased inductance components can be provided without providing bending portions, when forming microstrip lines between the side wall and the base board.

The surface acoustic wave filter device according to preferred embodiments of the present invention can be provided in various communication apparatuses and signal processing devices, in particular, small communication apparatuses such as portable phone.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave filter device comprising:
   a surface acoustic wave filter element including a piezoelectric substrate and a plurality of one terminal pair surface acoustic wave elements provided on said piezoelectric substrate, said plurality of one terminal pair surface acoustic wave elements being connected so as to define a parallel arm resonator and a series arm resonator in a ladder circuit;
   a package accommodating said surface acoustic wave filter element;
   said surface acoustic wave filter element being bonded via a plurality of bumps by a face down mounting process and being accommodated in said package; and
   an inductance component defined by a microstrip line which is provided in said package and connected to at least one of said series arm resonator and said parallel arm resonator; wherein
   the package includes a die-attach portion including a plurality of electrode pads which are connected via said plurality of bumps to one of a signal terminal and a ground terminal of the surface acoustic wave filter element;
   at least a majority of the inductance component is located outside an area defined by the die-attach portion;
   said package includes a plurality of external electrodes which are electrically connected to at least one of said plurality of electrode pads, and connected to one of a signal line and a ground line outside the surface acoustic wave filter device; and
   said microstrip line is connected between said electrode pad connected to the signal terminal of said series arm resonator and said external electrode connected to the signal line outside said surface acoustic wave filter device.

2. A surface acoustic wave filter device in accordance with claim 1, wherein said plurality of external electrodes extend from a top surface of said package to a bottom surface of said package.

3. A surface acoustic wave filter device in accordance with claim 1, wherein said microstrip line is disposed in the package at a position other than the position of said die-attach portion.

4. A surface acoustic wave filter device in accordance with claim 1, wherein said package includes a first case member on which said surface acoustic wave filter element is mounted, and a second case member enclosing the surface acoustic wave filter element mounted on the first case member, wherein a main portion of said microstrip line is provided inside said first case member.

5. A communication device comprising a surface acoustic wave filter device in accordance with claim 1.

6. A surface acoustic wave filter device in accordance with claim 1, wherein the signal terminal which is located at an input/output end of said surface acoustic wave filter element and at least one ground terminal thereof are arranged so as to be rotated by approximately 90° about an imaginary line, which passes through a center of the piezoelectric substrate of said surface acoustic wave filter element, and which is substantially perpendicular to the piezoelectric substrate, with respect to one of the plurality of external electrodes that is connected to the signal line at the input/output end and one of the plurality of external electrodes that is connected to at least one ground potential.

7. A surface acoustic wave filter device comprising:
   a surface acoustic wave filter element including a piezoelectric substrate and a plurality of one terminal pair surface acoustic wave elements provided on said piezoelectric substrate, said plurality of one terminal pair surface acoustic wave elements being connected so as to define a parallel arm resonator and a series arm resonator in a ladder circuit;
   a package accommodating said surface acoustic wave filter element;
   said surface acoustic wave filter element being bonded via a plurality of bumps by a face down mounting process and being accommodated in said package;
   an inductance component defined by a microstrip line which is provided in said package and connected to at least one of said series arm resonator and said parallel arm resonator; and
   at least two of said parallel arm resonators; wherein
   the package includes a die-attach portion including a plurality of electrode pads which are connected via said plurality of bumps to one of a signal terminal and a ground terminal of the surface acoustic wave filter element;
   at least a majority of the inductance component is located outside an area defined by the die-attach portion;
   said package includes a plurality of external electrodes which are electrically connected to at least one of said plurality of electrode pads, and connected to one of a signal line and a ground line outside the surface acoustic wave filter device; and
   ground terminals of said at least two parallel arm resonators are commonly connected on said piezoelectric substrate, and said microstrip line is connected between the portion where the ground terminals of said parallel arm resonators are commonly connected and the plurality of external electrodes provided on said package.

8. A surface acoustic wave filter device in accordance with claim 7, wherein said plurality of external electrodes extend from a top surface of said package to a bottom surface of said package.

9. A surface acoustic wave filter device in accordance with claim 7, wherein said microstrip line is disposed in the package at a position other than the position of said die-attach portion.

10. A surface acoustic wave filter device in accordance with claim 7, wherein said package includes a first case member on which said surface acoustic wave filter element is mounted, and a second case member enclosing the surface acoustic wave filter element mounted on the first case member, wherein a main portion of said microstrip line is provided inside said first case member.

11. A communication device comprising a surface acoustic wave filter device in accordance with claim 7.

12. A surface acoustic wave filter device in accordance with claim 7, wherein the signal terminal which is located at an input/output end of said surface acoustic wave filter element and at least one ground terminal thereof are arranged so as to be rotated by approximately 90° about an imaginary line, which passes through a center of the piezoelectric substrate of said surface acoustic wave filter element, and which is substantially perpendicular to the piezoelectric substrate, with respect to one of the plurality of external electrodes that is connected to the signal line at the input/output end and one of the plurality of external electrodes that is connected to at least one ground potential.

13. A surface acoustic wave filter device comprising:
a surface acoustic wave filter element including a piezoelectric substrate and a plurality of one terminal pair surface acoustic wave elements provided on said piezoelectric substrate, said plurality of one terminal pair surface acoustic wave elements being connected so as to define a parallel arm resonator and a series arm resonator in a ladder circuit;
a package accommodating said surface acoustic wave filter element;
said surface acoustic wave filter element being banded via a plurality of bumps by a face down mounting process and being accommodated in said package;
an inductance component defined by a microstrip line which is provided in said package and connected to at least one of said series arm resonator and said parallel arm resonator; and
at least two of said parallel arm resonators; wherein
the package includes a die-attach portion including a plurality of electrode pads which are connected via said plurality of bumps to one of a signal terminal and a ground terminal of the at least two of said parallel arm resonators;
at least a majority of the inductance component is located outside an area defined by the die-attach portion;
said package includes a plurality of external electrodes which are electrically connected to at least one of said plurality of electrode pads, and connected to one of a signal line and a ground line outside the surface acoustic wave filter device; and
said plurality of electrode pads connected to ground terminals of said at least two parallel arm resonators include a common electrode pad, and said microstrip line is provided on a path between said common electrode pad and said plurality of external electrodes.

14. A surface acoustic wave filter device in accordance with claim 13, wherein said plurality of external electrodes extend from a top surface of said package to a bottom surface of said package.

15. A surface acoustic wave filter device in accordance with claim 13, wherein said microstrip line is disposed in the package at a position other than the position of said die-attach portion.

16. A surface acoustic wave filter device in accordance with claim 13, wherein said package includes a first case member on which said surface acoustic wave filter element is mounted, and a second case member enclosing the surface acoustic wave filter element mounted on the first case member, wherein a main portion of said microstrip line is provided inside said first case member.

17. A communication device comprising a surface acoustic wave filter device in accordance with claim 13.

18. A surface acoustic wave filter device in accordance with claim 13, wherein the signal terminal which is located at an input/output end of said surface acoustic wave filter element and at least one ground terminal thereof are arranged so as to be rotated by approximately 90° about an imaginary line, which passes through a center of the piezoelectric substrate of said surface acoustic wave filter element, and which is substantially perpendicular to the piezoelectric substrate, with respect to one of the plurality of external electrodes that is connected to the signal line at the input/output end and one of the plurality of external electrodes that is connected to at least one ground potential.

19. A surface acoustic wave filter device comprising:
a surface acoustic wave filter element including a piezoelectric substrate and a plurality of one terminal pair surface acoustic wave elements provided on said piezoelectric substrate, said plurality of one terminal pair surface acoustic wave elements being connected so as to define a parallel arm resonator and a series arm resonator in a ladder circuit;
a package accommodating said surface acoustic wave filter element;
said surface acoustic wave filter element being bonded via a plurality of bumps by a face down mounting process and being accommodated in said package;
an inductance component defined by a microstrip line which is provided in said package and connected to at least one of said series arm resonator and said parallel arm resonator;
at least three of said parallel arm resonators; and
an electrode land which is provided on said piezoelectric substrate, and to which ground terminals of at least two of said at least three parallel arm resonators are connected; wherein
the package includes a die-attach portion including a plurality of electrode pads which are connected via said plurality of bumps to one of a signal terminal and a ground terminal of the surface acoustic wave filter element;
at least a majority of the inductance component is located outside an area defined by the die-attach portion;
said package includes a plurality of external electrodes which are electrically connected to at least one of said plurality of electrode pads, and connected to one of a signal line and a ground line outside the surface acoustic wave filter device;
said microstrip line is provided on a path between said electrode land connected to the ground terminals of the at least two parallel arm resonators and said external electrode to which said at least one of said plurality of electrode pads is connected; and
the parallel arm resonator other than said at least two parallel arm resonators is electrically isolated from said at least two parallel arm resonators on the piezoelectric substrate, and is electrically connected to one of said plurality of external electrodes that is not connected to said at least two parallel arm resonators.

20. A surface acoustic wave filter device in accordance with claim, 19, wherein said plurality of external electrodes extend from a top surface of said package to a bottom surface of said package.

21. A surface acoustic wave filter device in accordance with claim 19, wherein said microstrip line is disposed in the package at a position other than the position of said die-attach portion.

22. A surface acoustic wave filter device in accordance with claim 19, wherein said package includes a first case member on which said surface acoustic wave filter element is mounted, and a second case member enclosing the surface acoustic wave filter element mounted on the first case member, wherein a main portion of said microstrip line is provided inside said first case member.

23. A communication device comprising a surface acoustic wave filter device in accordance with claim 19.

24. A surface acoustic wave filter device in accordance with claim 19, wherein the signal terminal which is located at an input/output end of said surface acoustic wave filter element and at least one ground terminal thereof are arranged so as to be rotated by approximately 90° about an imaginary line, which passes through a center of the piezoelectric substrate of said surface acoustic wave filter element, and which is substantially perpendicular to the piezoelectric substrate, with respect to one of the plurality of external electrodes that is connected to the signal line at the input/output end and one of the plurality of external electrodes that is connected to at least one ground potential.

25. A surface acoustic wave filter device comprising:
a surface acoustic wave filter element including a piezoelectric substrate and a plurality of one terminal pair surface acoustic wave elements provided on said piezoelectric substrate, said plurality of one terminal pair surface acoustic wave elements being connected so as to define a parallel arm resonator and a series arm resonator in a ladder circuit;
a package accommodating said surface acoustic wave filter element;
said surface acoustic wave filter element being bonded via a plurality of bumps by a face down mounting process and being accommodated in said package;
an inductance component defined by a microstrip line which is provided in said package and connected to at least one of said series arm resonator and said parallel arm resonator; and
at least three of said parallel arm resonators; wherein
the package includes a die-attach portion including a plurality of electrode pads which are connected via said plurality of bumps to one of a signal terminal and a ground terminal of the surface acoustic wave filter element;
at least a majority of the inductance component is located outside an area defined by the die-attach portion;
said package includes a plurality of external electrodes which are electrically connected to at least one of said plurality of electrode pads, and connected to one of a signal line and a ground line outside the surface acoustic wave filter device;
said plurality of electrode pads include a common electrode pad connected to the ground terminals of at least two parallel arm resonators among said at least three parallel arm resonators; and
said microstrip line is provided on a path between the common electrode pad and the external electrode to which said common electrode pad is connected, and the parallel arm resonator other than said at least two parallel arm resonators is electrically isolated from said at least two parallel arm resonators at said die-attach portion, and is electrically connected to one of the plurality of external electrodes that is not connected to said at least two parallel arm resonators.

26. A surface acoustic wave filter device in accordance with claim 25, wherein said plurality of external electrodes extend from a top surface of said package to a bottom surface of said package.

27. A surface acoustic wave filter device in accordance with claim 25, wherein said microstrip line is disposed in the package at a position other than the position of said die-attach portion.

28. A surface acoustic wave filter device in accordance with claim 25, wherein said package includes a first case member on which said surface acoustic wave filter element is mounted, and a second case member enclosing the surface acoustic wave filter element mounted on the first case member, wherein a main portion of said microstrip line is provided inside said first case member.

29. A communication device comprising a surface acoustic wave filter device in accordance with claim 25.

30. A surface acoustic wave filter device in accordance with claim 25, wherein the signal terminal which is located at an input/output end of said surface acoustic wave filter element and at least one ground terminal thereof are arranged so as to be rotated by approximately 90° about an imaginary line, which passes through a center of the piezoelectric substrate of said surface acoustic wave filter element, and which is substantially perpendicular to the piezoelectric substrate, with respect to one of the plurality of external electrodes that is connected to the signal line at the input/output end and one of the plurality of external electrodes that is connected to at least one ground potential.

31. A surface acoustic wave filter device comprising:
a surface acoustic wave filter element including a piezoelectric substrate and a plurality of one terminal pair surface acoustic wave elements provided on said piezoelectric substrate, said plurality of one terminal pair surface acoustic wave elements being connected so as to define a parallel arm resonator and a series arm resonator in a ladder circuit;
a package accommodating said surface acoustic wave filter element;
said surface acoustic wave filter element being bonded via a plurality of bumps by a face down mounting process and being accommodated in said package; and
an inductance component defined by a microstrip line which is provided in said package and connected to at least one of said series arm resonator and said parallel arm resonator; wherein
the package includes a die-attach portion including a plurality of electrode pads which are connected via said plurality of bumps to one of a signal terminal and a ground terminal of the surface acoustic wave filter element;
at least a majority of the inductance component is located outside an area defined by the die-attach portion; and
said package includes a base board on which said surface acoustic wave filter element is mounted, an annular side wall provided on said base board, and a cap member attached to said annular side wall so as to close an upper end thereof, wherein a main portion of said microstrip line is disposed between said side wall and said base board.

32. A surface acoustic wave filter device in accordance with claim 31, wherein the signal terminal which is located at an input/output end of said surface acoustic wave filter element and at least one ground terminal thereof are arranged so as to be rotated by approximately 90° about an imaginary line, which passes through a center of the piezoelectric substrate of said surface acoustic wave filter element, and which is substantially perpendicular to the piezoelectric substrate, with respect to one of the plurality of external electrodes that is connected to the signal line at the input/output end and one of the plurality of external electrodes that is connected to at least one ground potential.

33. A surface acoustic wave filter device in accordance with claim 31, wherein said microstrip line is disposed in the package at a position other than the position of said die-attach portion.

34. A communication device comprising a surface acoustic wave filter device in accordance with claim 31.

35. A surface acoustic wave filter device comprising:
a surface acoustic wave filter element including a piezoelectric substrate and a plurality of one terminal pair surface acoustic wave elements provided on said piezoelectric substrate, said plurality of one terminal pair surface acoustic wave elements being connected so as to define a parallel arm resonator and a series arm resonator in a ladder circuit;

a package accommodating said surface acoustic wave filter element;

said surface acoustic wave filter element being bonded via a plurality of bumps by a face down mounting process and being accommodated in said package; and an inductance component defined by a microstrip line which is provided in said package and connected to at least one of said series arm resonator and said parallel arm resonator; wherein the package includes a die-attach portion including a plurality of electrode pads which are connected via said plurality of bumps to one of a signal terminal and a ground terminal of the surface acoustic wave filter element;

at least a majority of the inductance component is located outside an area defined by the die-attach portion;

said package includes a plurality of external electrodes which are electrically connected to at least one of said plurality of electrode pads, and connected to one of a signal line and a ground line outside the surface acoustic wave filter device; and the signal terminal which is located at an input/output end of said surface acoustic wave filter element and at least one ground terminal thereof are arranged so as to be rotated by approximately 90° about an imaginary line, which passes through a center of the piezoelectric substrate of said surface acoustic wave filter element, and which is substantially perpendicular to the piezoelectric substrate, with respect to one of the plurality of external electrodes that is connected to the signal line at the input/output end and one of the plurality of external electrodes that is connected to at least one ground potential.

36. A communication device comprising a surface acoustic wave filter device in accordance with claim 35.

37. A surface acoustic wave filter device in accordance with claim 35, wherein said plurality of external electrodes extend from a top surface of said package to a bottom surface of said package.

38. A surface acoustic wave filter device in accordance with claim 35, wherein said microstrip line is disposed in the package at a position other than the position of said die-attach portion.

39. A surface acoustic wave filter device in accordance with claim 35, wherein said package includes a first case member on which said surface acoustic wave filter element is mounted, and a second case member enclosing the surface acoustic wave filter element mounted on the first case member, wherein a main portion of said microstrip line is provided inside said first case member.

40. A surface acoustic wave filter device comprising:

a surface acoustic wave filter element including a piezoelectric substrate and a plurality of one terminal pair surface acoustic wave elements provided on said piezoelectric substrate, said plurality of one terminal pair surface acoustic wave elements being connected so as to define a parallel arm resonator and a series arm resonator in a ladder circuit;

a package accommodating said surface acoustic wave filter element;

said surface acoustic wave filter element being bonded via a plurality of bumps by a face down mounting process and being accommodated in said package; and an inductance component defined by a microstrip line which is provided in said package and connected to at least one of said series arm resonator and said parallel arm resonator; wherein the package includes a die-attach portion including a plurality of electrode pads which are connected via said plurality of bumps to one of a signal terminal and a ground terminal of the surface acoustic wave filter element;

at least a majority of the inductance component is located outside an area defined by the die-attach portion;

said package includes a plurality of external electrodes which are electrically connected to at least one of said plurality of electrode pads, and connected to one of a signal line and a ground line outside the surface acoustic wave filter device; and said package includes a base board on which said surface acoustic wave filter element is mounted, an annular side wall provided on said base board, and a cap member attached to said annular side wall so as to close an upper end thereof, wherein a main portion of said microstrip line is disposed between said side wall and said base board.

41. A surface acoustic wave filter device in accordance with claim 40, wherein said plurality of external electrodes extend from a top surface of said package to a bottom surface of said package.

42. A surface acoustic wave filter device in accordance with claim 40, wherein said microstrip line is provided between said electrode pad which is connected to a ground terminal of said parallel arm resonator via said bump, and said external electrode which is connected to the ground line outside the package.

43. A surface acoustic wave filter device in accordance with claim 40, wherein said microstrip line is disposed in the package at a position other than the position of said die-attach portion.

44. A communication device comprising a surface acoustic wave filter device in accordance with claim 40.

45. A surface acoustic wave filter device in accordance with claim 40, wherein the signal terminal which is located at an input/output end of said surface acoustic wave filter element and at least one ground terminal thereof are arranged so as to be rotated by approximately 90° about an imaginary line, which passes through a center of the piezoelectric substrate of said surface acoustic wave filter element, and which is substantially perpendicular to the piezoelectric substrate, with respect to one of the plurality of external electrodes that is connected to the signal line at the input/output end and one of the plurality of external electrodes that is connected to at least one ground potential.

* * * * *